(12) United States Patent
Kamiyama et al.

(10) Patent No.: US 8,947,646 B2
(45) Date of Patent: *Feb. 3, 2015

(54) PHOTOELECTRIC CONVERSION ELEMENT, LIGHT RECEIVING DEVICE, LIGHT RECEIVING SYSTEM, AND DISTANCE MEASURING DEVICE

(75) Inventors: Tomoyuki Kamiyama, Wako (JP); Keisuke Korekado, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 324 days.

This patent is subject to a terminal disclaimer.

(21) Appl. No.: 13/500,798

(22) PCT Filed: Oct. 1, 2010

(86) PCT No.: PCT/JP2010/067202
§ 371 (c)(1),
(2), (4) Date: Apr. 6, 2012

(87) PCT Pub. No.: WO2011/043252
PCT Pub. Date: Apr. 14, 2011

(65) Prior Publication Data
US 2012/0194799 A1 Aug. 2, 2012

(30) Foreign Application Priority Data
Oct. 7, 2009 (JP) ................. 2009-233680

(51) Int. Cl.
*G01C 3/08* (2006.01)
*G01S 17/10* (2006.01)
(Continued)

(52) U.S. Cl.
CPC .............. *G01S 17/10* (2013.01); *G01S 7/4816* (2013.01); *G01S 7/484* (2013.01); *G01S 7/4868* (2013.01);
(Continued)

(58) Field of Classification Search
USPC .............. 356/5.01, 5.03; 250/214.1; 257/431, 257/435, E31.124
See application file for complete search history.

(56) References Cited

U.S. PATENT DOCUMENTS 4,808,833 A * 2/1989 Saito ........................... 250/578.1
5,576,763 A * 11/1996 Ackland et al. ............... 348/308
(Continued)

FOREIGN PATENT DOCUMENTS

JP 08-56011 A 2/1996
JP 2005-302888 A 10/2005
(Continued)

OTHER PUBLICATIONS

Koji Yamamoto, "Research in Relation to CMOS Image Sensors Capable of Modulated Light Component Detection by Allocated Transfer and Subregion High Speed Readout Methods," Nara Institute of Science and Technology Busshitsu Sosei Kagaku Kenkyuka, Mar. 2006.
(Continued)

*Primary Examiner* — Luke Ratcliffe
*Assistant Examiner* — Assres H Woldemaryam
(74) *Attorney, Agent, or Firm* — Squire Patton Boggs (US) LLP

(57) ABSTRACT

A first photoelectric conversion element for detecting light and converting the light into photoelectrons comprises one buried photodiode formed in a semiconductor substrate, and a plurality of MOS diodes each having an electrode formed on the semiconductor substrate with an insulator interposed therebetween. The buried photodiode has a comb shape, in which a plurality of diverging portions are disposed to diverge from one portion, when viewed from the top thereof, and the respective electrodes of the MOS diodes are disposed so as to be nested between the plurality of diverging portions of the buried photodiode when viewed from the tops thereof.

10 Claims, 28 Drawing Sheets

(51) Int. Cl.
- *G01S 7/481* (2006.01)
- *G01S 7/484* (2006.01)
- *G01S 7/486* (2006.01)
- *G01S 7/487* (2006.01)
- *G01S 17/89* (2006.01)
- *H01L 27/146* (2006.01)
- *H01L 31/0224* (2006.01)
- *H01L 31/103* (2006.01)
- *H01L 31/109* (2006.01)

(52) U.S. Cl.
CPC ............... *G01S 7/4876* (2013.01); *G01S 17/89* (2013.01); *H01L 27/14607* (2013.01); *H01L 27/1461* (2013.01); *H01L 31/022408* (2013.01); *H01L 31/103* (2013.01); *H01L 31/109* (2013.01)
USPC ...................................... 356/5.01; 250/214.1

(56) References Cited

U.S. PATENT DOCUMENTS

| | | | |
|---|---|---|---|
| 5,880,494 A * | 3/1999 | Watanabe | 257/225 |
| 6,140,630 A | 10/2000 | Rhodes | |
| 7,880,788 B2 * | 2/2011 | Kamiyama et al. | 348/308 |
| 7,920,185 B2 * | 4/2011 | Ovsiannikov | 348/245 |
| 7,923,673 B2 * | 4/2011 | Buttgen et al. | 250/208.1 |
| 2004/0080643 A1 * | 4/2004 | Peng | 348/294 |
| 2005/0263764 A1 * | 12/2005 | Kim et al. | 257/69 |
| 2006/0255381 A1 * | 11/2006 | McKee | 257/292 |

FOREIGN PATENT DOCUMENTS

| | | | |
|---|---|---|---|
| JP | 2007-95849 A | | 4/2007 |
| JP | 2008-4692 A | | 1/2008 |
| JP | 2009-174830 A | | 8/2009 |

OTHER PUBLICATIONS

Ryohei Miyagawa et al., "CCD-Based Range-Finding Sensor," IEEE Transactions on Electron Devices, vol. 44, No. 10, Oct. 1997, pp. 1648-1652.

International Search Report corresponding to International Application No. PCT/JP2010/067202 dated Jan. 11, 2011.

U.S. Office Action U.S. Appl. No. 13/500,746 dated Jan. 31, 2014.

* cited by examiner

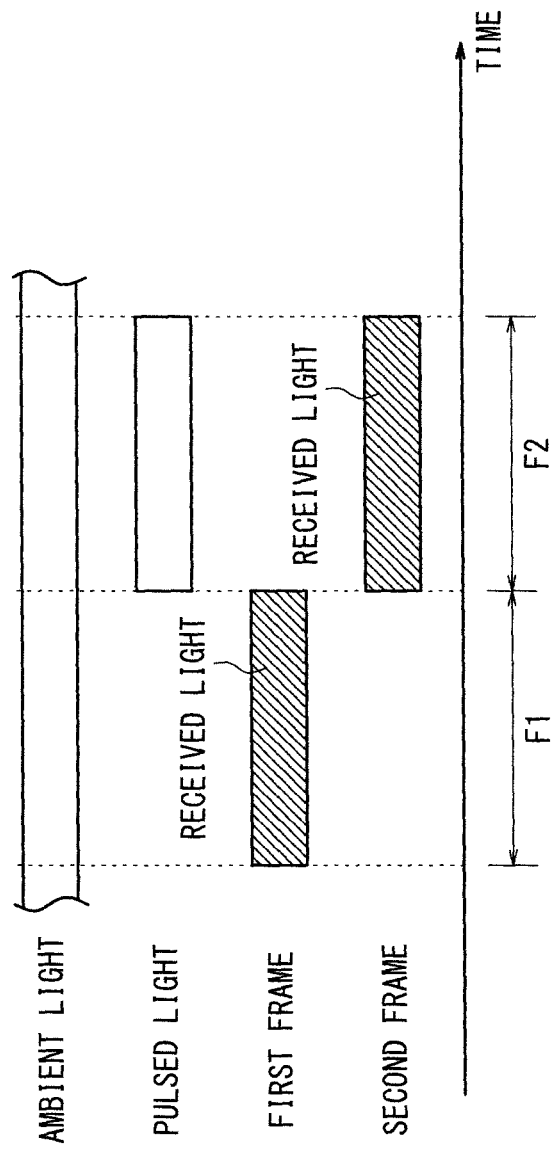

FIG. 25A
BPD
(NARROW)

32c1

FIG. 25B
BPD
(WIDE)

32c2

↓ POTENTIAL

PHOTOELECTRIC CONVERSION ELEMENT, LIGHT RECEIVING DEVICE, LIGHT RECEIVING SYSTEM, AND DISTANCE MEASURING DEVICE

TECHNICAL FIELD

The present invention relates to a photoelectric conversion element that converts light into an electric charge corresponding to the light amount thereof, a light receiving device that acquires luminance information of incident light to the photoelectric conversion element in a fixed time period, a light receiving system in which the influence of ambient light is controlled using the photoelectric conversion element, and a distance measuring device in which the principles of a time-of-flight (TOF) method are applied using the light receiving system.

BACKGROUND ART

Heretofore, an image sensor has been proposed, which is capable of signal detection at a high S/N ratio while removing the influence of ambient light (see, Koji Yamamoto, "Furiwake Tenso Hoshiki Oyobi Bubun Ryoiki Kosoku Yomidashi Hoshiki ni yoru Hencho Hikari Seibun Kenshutsu Kano na CMOS Image Sensor ni Kansuru Kenkyu (Research in Relation to CMOS Image Sensors Capable of Modulated Light Component Detection by Allocated Transfer and Subregion High Speed Readout Methods)," Graduate School of Materials Science, Nara Institute of Science and Technology, March 2006, hereinafter referred to as Document 1). The image sensor disclosed in Document 1 detects modulated light components using a charge allocation transfer method. However, the pixel circuitry thereof is of a structure in which two normal PG (photogate) method image sensors are used in combination and assembled together with a common PG as a light receiving element. Such an image sensor includes a structure in which there are two transfer gates sandwiching one light receiving element therebetween, and signal charge accumulating units are disposed on respective outer sides of the transfer gates. Further, according to Document 1, for increasing sensitivity, a structure is proposed in which the PG percentage formed by polysilicon is reduced. More specifically, an example is disclosed in which the PG is formed in a comb-like shape.

Further, as an exemplary application of an image sensor, a distance measuring system is known for measuring in a non-contact manner the distance to an object. Such a distance measuring system utilizes a time-of-flight (TOF) method. The TOF method operates by irradiating light with respect to an object, measuring a time period from irradiation of the light to impingement of the light on an object and until the light rebounds and is returned back, and then measuring the distance to the object based on this period and the speed of light (see, Ryohei Miyagawa and Takeo Kanade, "CCD-Based Range-Finding Sensor," IEEE Transactions on Electron Devices, Vol. 44, No. 10, October 1997, pp. 1648 through 1652, hereinafter referred to as Document 2).

According to Document 2, there is disclosed in detail the irradiation timing of pulsed light in a distance measuring system, and the operational timing of two light receiving elements. More specifically, an irradiation timing and an irradiation stop timing of pulsed light are repeated at the same length (i.e., the light emitting element is driven at a duty ratio of 50%), and charges are transferred alternately in two directions in synchronism with irradiation and non-irradiation of the pulsed light (see FIG. 1 of Document 2). In addition, a period over which the pulsed light is reflected by an object and returned is measured based on the phase difference of two output voltages.

SUMMARY OF INVENTION

Incidentally, for realizing a distance measuring apparatus by a TOF method, it is required for received photoelectrons (i.e., charges acquired by photoelectric conversion) to be transferred at high speeds.

In the image sensor of the aforementioned Document 1, for improving sensitivity, an example is disclosed in which the PG (photogate) is formed in a comb-like shape. In this case, within the light receiving element, the PG portion thereof includes a function for transferring to an output side stored charges (photoelectrons). However, portions thereof apart from the PG do not possess such a function. Accordingly, a problem occurs in that time is required for transferring to the output side all of the photoelectrons stored in the light-receiving element.

Further, in relation to receipt of mixed light made up of ambient light and modulated light at a certain timing, and receipt of modulated light at a different timing, it is necessary for charges to be transferred alternately in two directions in synchronism with irradiation and non-irradiation of the modulated light. For this purpose, photoelectrons that are photoelectrically converted in the photoelectron conversion element must be transferred at high speeds to respective nodes via desired gate electrodes. In particular, for acquiring a sufficient signal-to-noise ratio (S/N ratio) a photoelectric conversion element having a large light receiving area is required. However, in the case of using a large photoelectric conversion element, the distance to the output node is long, and hence it is difficult for the photoelectrically converted photoelectrons to be transferred at high speeds to a desired node.

Furthermore, in the case that photoelectrons are allocated to two nodes from the photoelectric conversion element, if the distances to respective gate electrodes from the photoelectric conversion element are different, then a difference in the transfer efficiency to the two nodes occurs, which results in lowering of the S/N ratio, caused by the existence of an in-plane distribution in the conversion efficiency of the photoelectric conversion element, or differences in the transfer paths of the photoelectrons.

The present invention has been made in consideration of the aforementioned problems, and has the object of providing a photoelectric conversion element in which photoelectrons obtained by photoelectric conversion can be transferred at high speeds to a desired region and accumulated therein, in which a distance measuring device can be realized by applying the principles of a TOF method, and which further enables the invention to be applied to various light receiving devices.

Another object of the present invention is to provide a light receiving device in which luminance information can be acquired highly accurately of incident light within a fixed time period using the photoelectric conversion element having the aforementioned effects, the light receiving device further being combined with an electronic shutter function.

A further object of the present invention is to provide a light receiving system in which the S/N ratio can be improved, the influence of ambient light noise components can be reduced, and which enables necessary light components to be detected with high accuracy.

A still further object of the present invention is to provide a distance measuring device in which the S/N ratio can be improved, the influence of ambient light noise components can be reduced, and which enables the distance to an object to be measured with high accuracy.

[1] A photoelectric conversion element for detecting light and converting the light into photoelectrons according to a first aspect of the present invention comprises an embedded photodiode formed in a semiconductor substrate and a plurality of MOS diodes having electrodes formed on the semiconductor substrate with an insulator therebetween, wherein the embedded photodiode has a comb-like shape when viewed from an upper surface thereof, in which plural branch portions are branched from one portion, and the electrodes of the MOS diodes are nested, respectively, between the branch portions of the embedded photodiode when viewed from the upper surface thereof.

[2] In the first aspect of the present invention, a potential under the electrodes of the MOS diodes is controlled, such that the photoelectrons generated at least by photoelectric conversion at the MOS diodes migrate toward the embedded photodiode.

[3] In the first aspect of the present invention, within the embedded photodiode, a portion corresponding to a base of the one portion of the embedded photodiode is constituted as a charge accumulating unit.

[4] In the first aspect of the present invention, the plural branch portions of the embedded photodiode and the electrodes in the MOS diodes are rectangular-shaped respectively.

[5] In the first aspect of the present invention, each of the plural branch portions of the embedded photodiode are shaped so as to become gradually greater in width toward the one portion as viewed from the upper surface thereof, and each of the electrodes of the MOS diodes is shaped so as to become gradually smaller in width toward the one portion of the embedded photodiode as viewed from the upper surface thereof.

[6] In the first aspect of the present invention, the one portion of the embedded photodiode is shaped so as to become gradually greater in width toward the base of the one electrode portion as viewed from the upper surface thereof.

[7] In the first aspect of the present invention, power supply terminals of each of the electrodes in the MOS diode are formed at positions maximally separated from the charge accumulating unit, as viewed from the upper surface thereof.

[8] A light receiving device that acquires luminance information of incident light according to a second aspect of the present invention comprises a photoelectric conversion element, which detects and converts incident light into photoelectrons, a charge accumulating unit for accumulating photoelectrons generated by the photoelectric conversion element, a capacitor that stores the photoelectrons at a fixed time period, a charge discharging unit that discharges the photoelectrons, a first MOS-type switching element disposed between the charge accumulating unit and the capacitor for causing the photoelectrons accumulated in the charge accumulating unit to migrate toward the capacitor, and a second MOS-type switching element disposed between the charge accumulating unit and the charge discharging unit for controlling discharge of the photoelectrons from the charge accumulating unit to the charge discharging unit. The photoelectric conversion element thereof comprises an embedded photodiode formed in a semiconductor substrate and a plurality of MOS diodes having electrodes formed on the semiconductor substrate with an insulator therebetween, wherein the embedded photodiode has a comb-like shape when viewed from an upper surface thereof, in which plural branch portions are branched from one portion, the electrodes of the MOS diodes are nested, respectively, between the plural branch portions of the embedded photodiode when viewed from the upper surface thereof, and the photoelectrons from the photoelectric conversion element are transferred to the capacitor by selectively controlling opening/closing of the first switching element and the second switching element, whereby luminance information of incident light is acquired based on an amount (charge amount) of the photoelectrons transferred to the capacitor.

[9] In the second aspect of the present invention, the charge accumulating unit is connected to the photoelectric conversion element, and the charge discharging unit is disposed to confront the capacitor while sandwiching the charge accumulating unit therebetween.

[10] In the second aspect of the present invention, the capacitor comprises one of a MIM capacitor, a MOS capacitor, an embedded photodiode structure, and a pn junction parasitic capacitance.

[11] In the second aspect of the present invention, at least the charge accumulating unit, the first switching element, the second switching element, and the capacitor are formed in a light shielded region.

[12] A light receiving device that acquires luminance information of incident light according to a third aspect of the present invention comprises a photoelectric conversion element, which detects and converts the incident light into photoelectrons, a charge accumulating unit for accumulating photoelectrons generated by the photoelectric conversion element, a first capacitor and a second capacitor that store the photoelectrons at a fixed time period, a charge discharging unit that discharges the photoelectrons, a first MOS-type switching element disposed between the charge accumulating unit and the first capacitor for allocating the photoelectrons accumulated in the charge accumulating unit selectively to the first capacitor, and a second MOS-type switching element disposed between the charge accumulating unit and the second capacitor for allocating the photoelectrons accumulated in the charge accumulating unit selectively to the second capacitor, and a third MOS-type switching element for controlling discharge of the photoelectrons from the charge accumulating unit to the charge discharging unit. The photoelectric conversion element comprises an embedded photodiode formed in a semiconductor substrate and a plurality of MOS diodes having electrodes formed on the semiconductor substrate with an insulator therebetween, wherein the embedded photodiode has a comb-like shape when viewed from an upper surface thereof, in which plural branch portions are branched from one portion, the electrodes of the MOS diodes are nested, respectively, between the plural branch portions of the embedded photodiode when viewed from the upper surface thereof, and the photoelectrons from the photoelectric conversion element are transferred to the first capacitor and the second capacitor by selectively controlling ON/OFF states of the first through third switching elements, whereby luminance information of incident light is acquired based on an amount (charge amount) of the photoelectrons transferred to the first capacitor and the second capacitor.

[13] In the third aspect of the present invention, the charge accumulating unit is connected to the photoelectric conversion element, the charge discharging unit is disposed to confront the photoelectric conversion element while sandwiching the charge accumulating unit therebetween, and the first capacitor and the second capacitor are disposed to mutually confront one another while sandwiching the charge accumulating unit therebetween.

[14] In the third aspect of the present invention, the first capacitor and the second capacitor comprise one of a MIM capacitor, a MOS capacitor, an embedded photodiode structure, and a pn junction parasitic capacitance.

[15] In the third aspect of the present invention, at least the charge accumulating unit, the first through third switching elements, the first capacitor, and the second capacitor are formed in a light shielded region.

[16] A light receiving system according to a fourth aspect of the present invention comprises a light emitting device that irradiates pulsed light with respect to an object, a light receiving device that receives reflected light of the pulsed light and carries out an output responsive to a received light amount, and a controller that controls the light emitting device and the light receiving device. The light receiving device comprises a photoelectric conversion element, which detects and converts the reflected light into photoelectrons, a charge accumulating unit for accumulating photoelectrons generated by the photoelectric conversion element, a pair of capacitors that store the photoelectrons at a fixed time period, a charge discharging unit that discharges the photoelectrons, a pair of MOS-type switching elements disposed between the charge accumulating unit and the pair of capacitors for selectively allocating the photoelectrons accumulated in the charge accumulating unit to the pair of capacitors in synchronism with driving of the light emitting device, and a third MOS-type switching element for controlling discharge of the photoelectrons from the charge accumulating unit to the charge discharging unit in synchronism with driving of the light emitting device. The photoelectric conversion element comprises an embedded photodiode formed in a semiconductor substrate and a plurality of MOS diodes having electrodes formed on the semiconductor substrate with an insulator therebetween, wherein the embedded photodiode has a comb-like shape when viewed from an upper surface thereof, in which plural branch portions are branched from one portion, and the electrodes are nested, respectively, between the plural branch portions of the embedded photodiode when viewed from the upper surface thereof. The controller turns ON a first switching element from among the pair of switching elements and transfers the photoelectrons from the photoelectric conversion element to a first capacitor from among the pair of capacitors, in a first period that resides within a period in which the pulsed light from the light emitting device is not irradiated, turns ON a second switching element from among the pair of switching elements and transfers the photoelectrons from the photoelectric conversion element to a second capacitor from among the pair of capacitors, in a second period that resides within a period in which the pulsed light from the light emitting device is irradiated, turns ON the third switching element and controls the charge discharging unit to discharge the photoelectrons from the photoelectric conversion element, within a period outside of the first period and the second period, and acquires luminance information of the reflected light based on an amount (charge amount) of the photoelectrons transferred to the first capacitor and an amount (charge amount) of the photoelectrons transferred to the second capacitor.

[17] In the fourth aspect of the present invention, there are further provided a power source and a MOS-type first reset switch and a MOS-type second reset switch for setting potentials of the first capacitor and the second capacitor to initial potentials.

[18] In the fourth aspect of the present invention, there are further provided a first amplifier and a second amplifier for converting respectively to electric signals of a level corresponding to potentials based on the amount of photoelectrons stored in the first capacitor and the second capacitor.

[19] In the fourth aspect of the present invention, there are further provided a first charge holding unit and a second charge holding unit constituted by a MOS capacitor or an embedded photodiode structured parasitic capacitance, for temporarily storing the photoelectrons transferred by the first switching element and the second switching element, and a first charge transfer unit and a second charge transfer unit constituted by MOS-type switching elements for transferring the photoelectrons, which are temporarily stored respectively in the first charge holding unit and the second charge holding unit, to the first capacitor and the second capacitor.

[20] A light receiving system according to a fifth aspect of the present invention comprises a light emitting device that irradiates pulsed light with respect to an object, a light receiving device that receives reflected light of the pulsed light and carries out an output responsive to a received light amount, and a controller that controls the light emitting device and the light receiving device. The light receiving device comprises a photoelectric conversion element, which detects and converts the reflected light into photoelectrons, a charge accumulating unit for accumulating photoelectrons generated by the photoelectric conversion element, first through fourth capacitors that store the photoelectrons at a fixed time period, a charge discharging unit that discharges the photoelectrons, first through fourth MOS-type switching elements disposed between the charge accumulating unit and the first through fourth capacitors for allocating the photoelectrons to the first through fourth capacitors in synchronism with irradiation of the pulsed light, and a fifth MOS-type switching element disposed between the charge accumulating unit and the charge discharging unit for controlling supply of the photoelectrons from the charge accumulating unit to the charge discharging unit. The photoelectric conversion element comprises an embedded photodiode formed in a semiconductor substrate and a plurality of MOS diodes having electrodes formed on the semiconductor substrate with an insulator therebetween, wherein the embedded photodiode has a comb-like shape when viewed from an upper surface thereof, in which plural branch portions are branched from one portion, the electrodes are nested, respectively, between the plural branch portions of the embedded photodiode when viewed from the upper surface thereof, and the controller controls irradiation of the pulsed light by the light emitting device and ON/OFF switching of the first through fourth switching elements, turns ON the fifth switching element and discharges the photoelectrons to the charge discharging unit at a time when all of the first through fourth switching elements are OFF, and acquires luminance information of the reflected light based on an amount (charge amount) of the photoelectrons transferred to the first through fourth switching elements.

[21] In the fifth aspect of the present invention, there is further provided a power source and first through fourth MOS-type reset switches for setting potentials of the first through fourth capacitors to initial potentials.

[22] In the fifth aspect of the present invention, there is further provided first through fourth amplifiers for converting respectively to electric signals of levels corresponding to potentials based on the amount of photoelectrons stored in the first through fourth capacitors.

[23] In the fifth aspect of the present invention, there is further provided first through fourth charge holding units constituted by a MOS capacitor or an embedded photodiode structured parasitic capacitance, for temporarily storing the photoelectrons transferred by the first through fourth switching elements, and first through fourth charge transfer units constituted by MOS-type switching elements for transferring the photoelectrons, which are temporarily stored respectively in the first through fourth charge holding units, respectively to the first through fourth capacitors.

[24] In the fourth and fifth aspects of the present invention, a structural element of the light receiving device is constituted by a structural element of one pixel portion of a line sensor array or a two dimensional image sensor array in which a plurality of pixels are provided.

[25] A distance measuring device according to a sixth aspect of the present invention comprises a light emitting device that irradiates pulsed light with respect to an object, a light receiving device that receives reflected light of the pulsed light and carries out an output responsive to a received light amount, a controller that controls the light emitting device and the light receiving device, and an arithmetic processor for calculating a distance to the object by a time-of-flight method using the output of the light receiving device. The light receiving device comprises a photoelectric conversion element, which detects and converts the reflected light into photoelectrons, a charge accumulating unit for accumulating photoelectrons generated by the photoelectric conversion element, first through fourth capacitors that store the photoelectrons at a fixed time period, a charge discharging unit that discharges the photoelectrons, first through fourth MOS-type switching elements disposed between the charge accumulating unit and the first through fourth capacitors for allocating the photoelectrons to the first through fourth capacitors in synchronism with irradiation of the pulsed light, and a fifth MOS-type switching element disposed between the charge accumulating unit and the charge discharging unit for controlling supply of the photoelectrons from the charge accumulating unit to the charge discharging unit. The photoelectric conversion element comprises an embedded photodiode and a plurality of MOS diodes having electrodes formed on a semiconductor substrate with an insulator therebetween, wherein the embedded photodiode has a comb-like shape when viewed from an upper surface thereof, in which plural branch portions are branched from one portion, and the electrodes of the MOS diodes are nested, respectively, between the plural branch portions of the embedded photodiode when viewed from the upper surface thereof. Assuming that an irradiation start time of the pulsed light is taken as time Teu, an irradiation end time of the pulsed light is taken as time Ted, an incidence end time of the reflected light with respect to the photoelectric conversion element is taken as time Trd, ON times of the first through fourth switching elements are taken respectively as times $Tg1u$, $Tg2u$, $Tg3u$, $Tg4u$, OFF times of the first through fourth switching elements are taken respectively as times $Tg1d$, $Tg2d$, $Tg3d$, $Tg4d$, a time period from time $Tg1u$ to time $Tg1d$ is taken as P1, a time period from time $Tg2u$ to time $Tg2d$ is taken as P2, a time period from time $Tg3u$ to time $Tg3d$ is taken as P3, a time period from time $Tg4u$ to time $Tg4d$ is taken as P4, a time period from time $Tg4u$ to time Trd is taken as Psr, an amount of photoelectrons stored in the first capacitor within time period P1 is taken as a charge amount Q1, an amount of photoelectrons stored in the second capacitor within time period P2 is taken as a charge amount Q2, an amount of photoelectrons stored in the third capacitor within time period P3 is taken as a charge amount Q3, an amount of photoelectrons stored in the fourth capacitor within time period P4 is taken as a charge amount Q4, a time period from irradiation of the pulsed light to reflection of the pulsed light by the object and until the reflected light returns is taken as a round-trip time period ΔP, and the distance between the object and the light emitting device and the light receiving device is taken as a distance D, then the controller controls irradiation of the pulsed light from the light emitting device and ON/OFF switching of the first through fourth switching elements, such that (1) P1=P3,
(2) P2=P4, and
(3) $Tg1u < Tg1d \leq Tg2u < Tg2d \leq Teu < Tg3u < Tg3d \leq Tg4u \leq Ted < Tg4d$, or, $Teu < Tg3u < Tg3d \leq Tg4u \leq Ted < Tg4d < Tg1u < Tg1d \leq Tg2u < Tg2d$, and turns ON the fifth switching element and discharges the photoelectrons to the charge discharging unit at a time when all of the first through fourth switching elements are OFF. The arithmetic processor acquires luminance information of the reflected light in time period P3 based on a difference between the charge amount Q3 that is stored in the third capacitor, which corresponds to ambient light and the reflected light, and the charge amount Q1 that is stored in the first capacitor, which corresponds to the ambient light, acquires luminance information of the reflected light in time period Psr based on a difference between the charge amount Q4 that is stored in the fourth capacitor, which corresponds to the ambient light and the reflected light, and the charge amount Q2 that is stored in the second capacitor, which corresponds to the ambient light, determines a ratio between the luminance information of the reflected light in time period P3 and the luminance information of the reflected light in time period Psr, calculates the round-trip time period ΔP based on the ratio between time period P3 and time period Psr, and measures the distance D based on the round-trip time period ΔP.

[26] In the sixth aspect of the present invention, the round-trip time period ΔP is calculated based on the following equation (1), when the time Ted and the time $Tg4u$ are equal, $$\Delta P = \{(Q4-Q2)/(Q3-Q1)\} \times P3 \quad (1)$$

and the round-trip time period ΔP is calculated based on the following equation (2), when the time Ted is later than the time $Tg4u$, $$\Delta P = [(Q4-Q2)/(Q3-Q1)] \times P3 - (Ted - Tg4u) \quad (2)$$

[27] In the sixth aspect of the present invention, the controller irradiates the pulsed light multiple times to the light receiving device in each of respective measurement cycles, and the arithmetic processor calculates the round-trip time period ΔP using charge amounts Q1 to Q4 after photoelectrons have been stored multiple times respectively in the first through fourth capacitors.

As described above, according to the photoelectric conversion element of the present invention, photoelectrons obtained by photoelectric conversion can be transferred at high speeds to a desired region and accumulated therein, and a distance measuring device can be realized by applying the principles of a TOF method, which further can be applied to various light receiving devices.

Further, according to the light receiving device of the present invention, luminance information can be acquired highly accurately of incident light within a predetermined time period using the photoelectric conversion element having the aforementioned effects, and the light receiving device can further be combined with an electronic shutter function.

Further, according to the light receiving system of the present invention, the S/N ratio can be improved, the influence of ambient light noise components can be reduced, and necessary light components can be detected with high accuracy.

Still further, according to the distance measuring device of the present invention, the S/N ratio can be improved, the influence of ambient light noise components can be reduced, and the distance to an object can be measured with high accuracy.

BRIEF DESCRIPTION OF DRAWINGS

FIG. 11 is a timing chart showing fundamental principles of a technique for reducing the influence of ambient light;

FIG. 25A is a potential diagram taken along line XXVA-XXVA in FIG. 24;

FIG. 25B is a potential diagram taken along line XXVB-XXVB in FIG. 24;

DESCRIPTION OF EMBODIMENTS

A photoelectric conversion element, a light emitting device, a light receiving system, and a distance measuring device according to embodiments of the present invention shall be described below with reference to FIGS. 1 through 28.

[Photoelectric Conversion Element 10]

Figure 1:
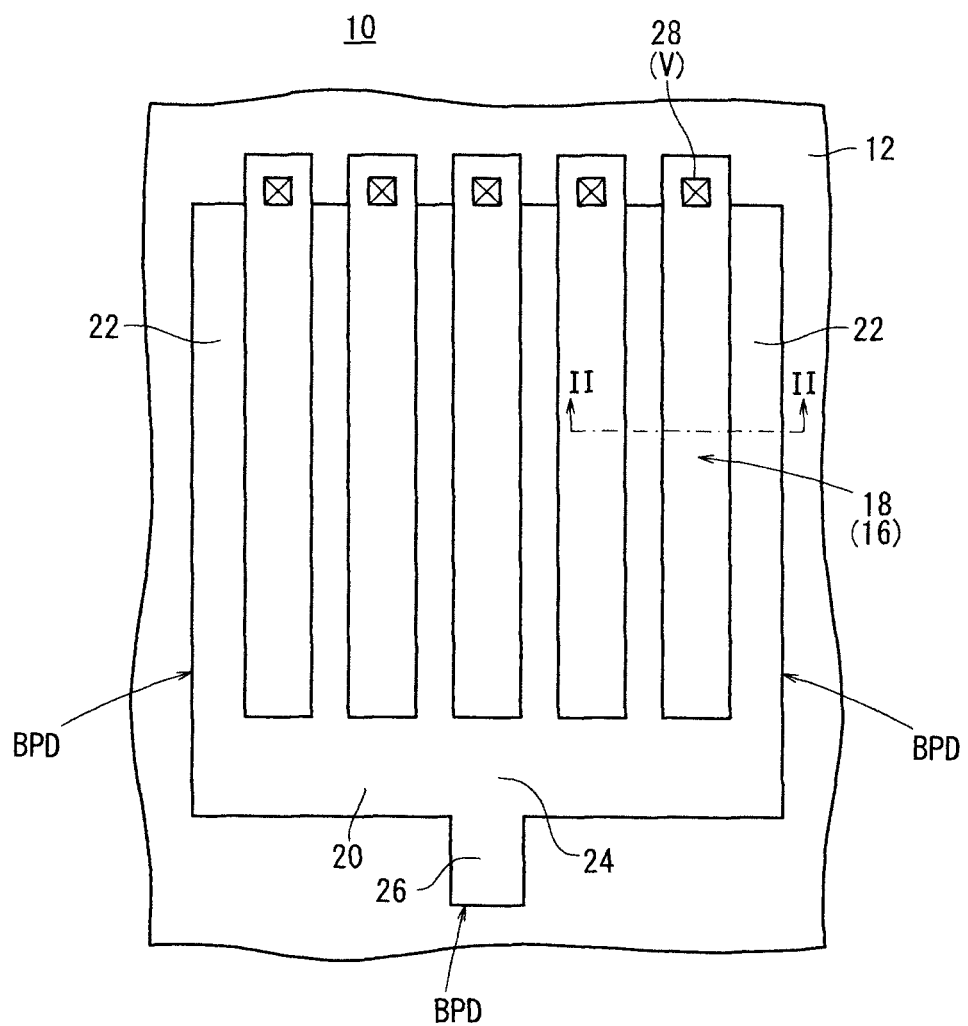
FIG. 1 is a view showing a photoelectric conversion element as seen from an upper surface thereof.
Figure 2:
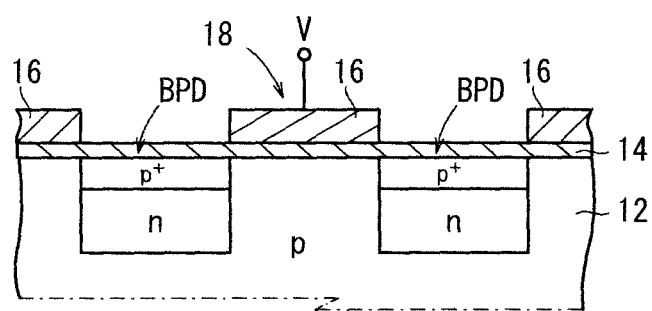
FIG. 2 is a cross sectional view taken along line II-II in FIG. 1.

First, as shown in FIGS. 1 and 2, a photoelectric conversion element 10 according to an embodiment of the present invention includes embedded photodiode BPD formed on a semiconductor substrate 12 (see FIG. 2) and a plurality of MOS diodes 18 having electrodes 16 formed on the semiconductor substrate 12 with an insulator 14 disposed therebetween. More specifically, as shown in FIG. 2, for example, the semiconductor substrate 12 is formed by a p-type impurity diffusion region. Additionally, the aforementioned MOS diode 18 is made by forming the electrode 16 from polysilicon or a metallic conductor or the like on the semiconductor substrate 12 via an insulator layer (insulator 14) made from $SiO_2$ or the like. Further, the aforementioned embedded photodiode BPD is constituted respectively by forming a high density p-type impurity diffusion region on the surface of an n-type impurity diffusion region, which itself is formed on a p-type impurity diffusion region.

As seen from the upper surface, the embedded photodiode BPD has a comb-like shape, in which a plurality of branch portions 22 are branched respectively from one portion 20. The electrodes 16 of the MOS diodes 18 are arranged to nest between the plural branch portions 22 of the embedded photodiode BPD. The branch portions 22 of the embedded photodiode BPD and the electrodes 16 in the MOS diodes 18 are rectangular shaped, respectively.

A charge accumulating unit 26 for accumulating photoelectrons that are generated by the photoelectric conversion element 10 is formed on a base portion 24 (substantially in the center in the lengthwise direction) of the one portion 20 on the embedded photodiode BPD. The charge accumulating unit 26 is formed to extend from the base portion 24 of the one portion 20 in an opposite direction from the branch portions 22. The charge accumulating unit 26 may be included structurally within the photoelectric conversion element 10, or may not be included therein.

Power supply terminals 28 of each of the electrodes 16 in the MOS diodes 18 are formed at positions maximally separated from the charge accumulating unit 26, as viewed from the upper surface. More specifically, the power supply terminals 28 are formed at ends, which are distanced from the charge accumulating unit 26, of each of the branch portions 22.

In addition, non-illustrated metal wires are provided to apply a voltage V to the power supply terminals 28. The voltage V is changed across a low level voltage VL to a high level voltage VH. The low level voltage VL may be a zero level voltage 0V or a negative voltage.

Operations of the photoelectric conversion element shall be explained with reference to the timing chart of FIG. 3 and the potential diagrams of FIGS. 4A to 4C. As can be understood intuitively from the fact that the potential diagrams of FIGS. 4A to 4C are applicable to photoelectrons 30 as charges, it is illustrated that the potential locations 32a become lower as the potentials go higher.

Figure 3:
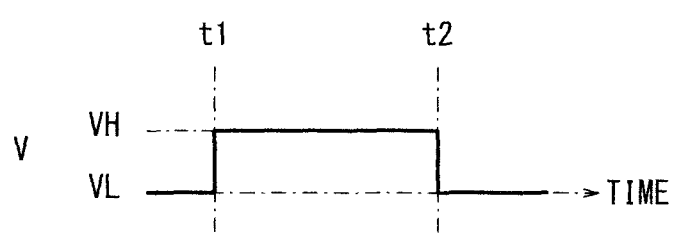
FIG. 3 is a timing chart showing operations of the photoelectric conversion element.
Figure 4A:
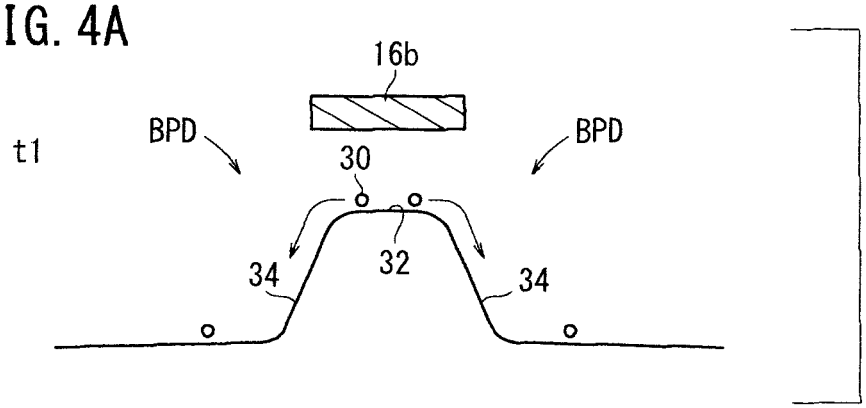
FIG. 4A and FIG. 4B are potential diagrams showing operations (i.e., operations at time t1, and t2 in FIG. 3) of the photoelectric conversion element.

First, at time t1 (initial exposure stage) shown in FIG. 3, when the voltage V becomes a high level VH, as shown in FIG. 4A, the potential locations 32 beneath the electrodes 16 become lower than the potential locations 32, whereby the photoelectrons 30 that are generated by exposure to light are accumulated under the electrodes 16.

Figure 4B:
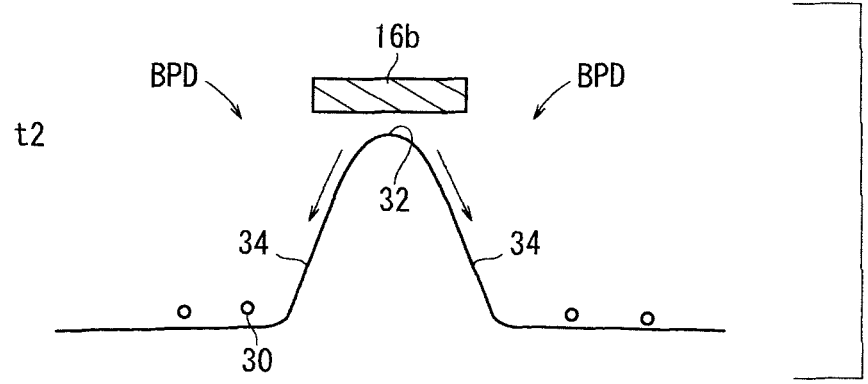
Figure 4C:
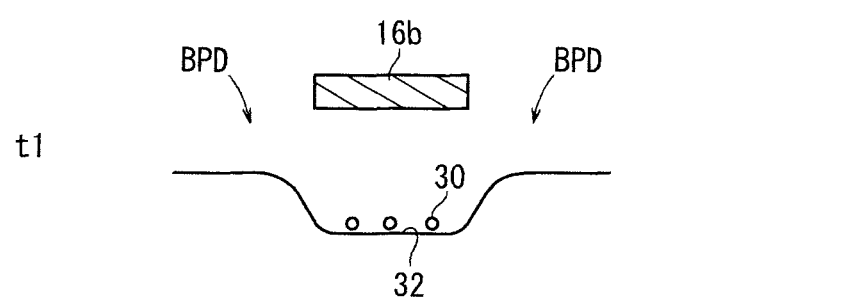
FIG. 4C is another potential diagram showing an operation (i.e., an operation at time t1 in FIG. 3) of the photoelectric conversion element.

Thereafter, at time t2 (exposure end stage) when the voltage V becomes a low level voltage VL, as shown in FIG. 4B, the potential locations 32 beneath the electrodes 16 rise, and a potential gradient 34 is formed from beneath the electrode 16 downward toward the potential location at the embedded photodiode BPD. From this fact, as a result of the potential gradient, the photoelectrons 30 that are accumulated under the electrodes 16 move (i.e., migrate) at high speeds to the embedded photodiode BPD, more specifically, to locations beneath the plural branch portions 22 thereof, and then migrate toward the charge accumulating unit 26.

In this manner, in the photoelectric conversion element 10, the MOS diodes 18 are arranged between the branch portions 22 of the embedded photodiode BPD, and by controlling the voltage V applied to the electrodes 16 of the MOS diodes, potential gradients 34 are formed by means of a difference in the potential locations that are formed under the electrode 16 and in the adjacent embedded photodiode BPD. Therefore, photoelectrons 30, which are acquired by photoelectric conversion, are capable of being transferred and accumulated at high speeds in the charge accumulating unit 26. Further, the embedded photodiode BPD is fully depleted device, such that residual charges can be suppressed and the photoelectrons transferred completely therefrom. Further, since a p-type high density region exists in the surface thereof, the occurrence of dark currents can advantageously be suppressed.

[First Light Receiving Device 100A]

Next, a light receiving device (hereinafter referred to as a first light receiving device 100A) according to a first embodiment shall be explained with reference to FIGS. 5 and 6.

Figure 5:
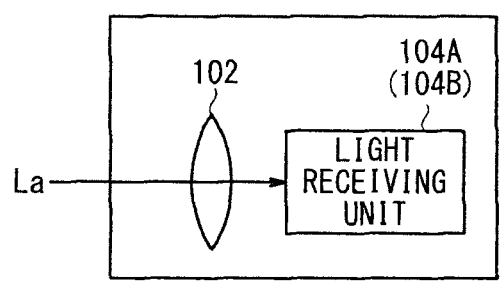
FIG. 5 is a schematic diagram showing features of the first photoelectric conversion element and the second photoelectric conversion element.

As shown in FIG. 5, the first light receiving device 100A includes a lens 102 and a first light receiving unit 104A. Incident light La that passes through the lens 102 is focused onto the first light receiving unit 104A. The lens 102 may also comprise a plurality of lenses, which are arrayed in a line or in a matrix.

Figure 6:
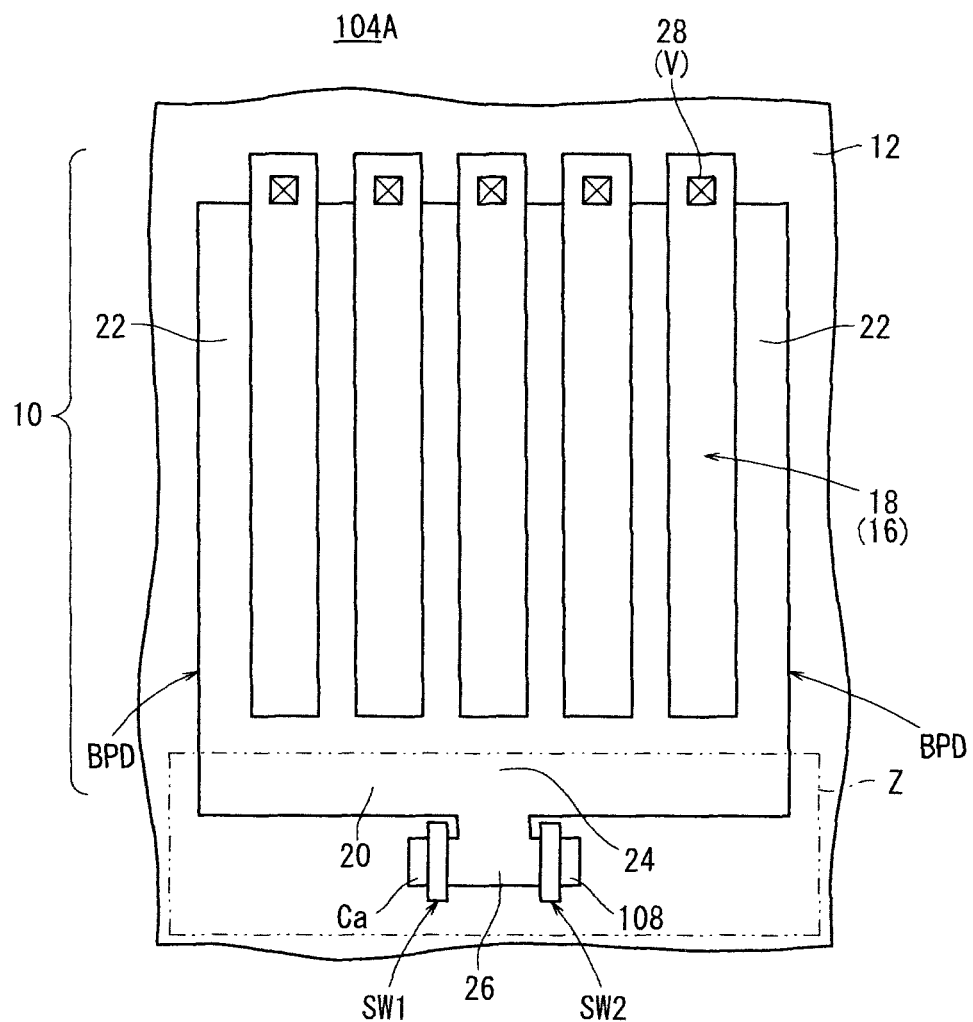
FIG. 6 is a view showing a first light receiving unit of a first light receiving device as seen from an upper surface thereof.

As shown in FIG. 6, the first light receiving unit 104A comprises a photoelectric conversion element 10, a charge accumulating unit 26 for accumulating photoelectrons that are generated by the photoelectric conversion element 10, a capacitor Ca for storing photoelectrons at a fixed time period, a charge discharging unit 108 that discharges the photoelectrons, a first switching element SW1 disposed between the charge accumulating unit 26 and the capacitor Ca for causing the photoelectrons accumulated in the charge accumulating unit 26 to migrate to the capacitor Ca, and a second switching element SW2 disposed between the charge accumulating unit 26 and the charge discharging unit 108 for controlling discharge of the photoelectrons from the charge accumulating unit 26 to the charge discharging unit 108. The charge discharging unit 108 is arranged to confront the capacitor Ca while sandwiching the charge accumulating unit 26 therebetween. With this embodiment, in particular, the capacitor Ca and the charge discharging unit 108 are arranged at symmetrical positions with respect to the center of the charge accumulating unit 26. The capacitor Ca is constituted by a MIM capacitor, a MOS capacitor, and embedded photodiode structure, or a pn junction parasitic capacitance.

The aforementioned photoelectric conversion element and the second photoelectric conversion element 10B are used in the photoelectric conversion element 10. In FIG. 6, an example is shown in which the photoelectric conversion element 10 is used as the photoelectric conversion element 10. In this case, the charge accumulating unit 26 of the photoelectric conversion element 10 or the charge accumulating unit 26 of the second photoelectric conversion element 10B may be used as the charge accumulating unit 26.

The first switching element SW1 includes a gate electrode disposed between the charge accumulating unit 26 and the capacitor Ca, an insulator body beneath the gate electrode, and a MOS structure, which is constituted in the semiconductor substrate 12 beneath the insulator body. The second switching element SW2 includes a gate electrode disposed between the charge accumulating unit 26 and the charge discharging unit 108, an insulator body beneath the gate electrode, and a MOS structure, which is constituted in the semiconductor substrate 12 beneath the insulator body. Accordingly, the first switching element SW1 and the second switching element SW2 are turned ON by applying high level voltages to the gate electrodes, and are turned OFF by applying low level voltages (which may be a zero level voltage 0V or a negative voltage) to the gate electrodes.

At least the charge accumulating unit 26, the capacitor Ca, the first switching element SW1, and the second switching element SW2 are formed in a light shielded region Z.

When the first light receiving device 100A is used, at first, light that is incident within a time period (hereinafter referred to as a "valid period") during which it is desired to acquire luminance information of specified incident light La is converted to photoelectrons in the photoelectric conversion element 10, and the photoelectrons are transferred and accumulated at high speeds in the charge accumulating unit 26 in accordance with the above operations. Thereafter, by turning ON the first switching element SW1, the photoelectrons of the charge accumulating unit 26 are transferred to the capacitor Ca, and luminance information of the incident light La is acquired based on the amount (charge amount) of photoelectrons transferred to the capacitor Ca. Then, following passage of a predetermined time period, the first switching element SW1 is turned OFF.

On the other hand, unnecessary light as well, which is incident outside of the valid period, is converted into photoelectrons at the photoelectric conversion element 10, and such photoelectrons are transferred and accumulated at high speeds in the charge accumulating unit 26 in accordance with the above operations. Thereafter, by turning ON the second switching element SW2, the unnecessary photoelectrons of the charge accumulating unit 26 are transferred to the charge discharging unit 108 and are discharged therefrom. Then, following passage of a predetermined time period, the second switching element SW2 is turned OFF.

Incidentally, as a method for improving the S/N ratio of the luminance information, a method exists in which, within a given time period plural valid periods are set, and photoelectrons are accumulated, which are acquired within such valid periods. In particular, by setting the valid period to be short, it is thought that the influence of ambient light can be eliminated. For example, plural periods or cycles are set within the given time period, each of such cycles being less than 100 μsec, and further, valid periods are set respectively within each of the cycles, wherein the duty ratio of each of the valid periods is made short.

When this method is adopted, it is necessary for the photoelectrons, which were photoelectrically converted in the photoelectric conversion element 10, to be transferred at high speeds to a node (i.e., a region where the photoelectrons are converted into electric signals). In particular, to obtain a high S/N ratio, a photoelectric conversion element having a large light receiving area is required. However, in the case of using a photoelectric conversion element having a large light receiving area, the distance to the node is long, and hence it is difficult for the photoelectrons to be transferred at high speeds to the node. For example, if a case is considered and explained in which an ordinary photoelectric conversion element (conventional photoelectric conversion element) is provided and used in the first light receiving device 100A, in the event that the time during which the first switching element SW1 is turned ON is on the order of a few hundred nsec, then the first switching element SW1 is turned OFF prior to the photoelectrons, which are photoelectrically converted and obtained in the photoelectric conversion element, arriving at the first switching element SW1, and thus the photoelectrons cannot be transferred to the capacitor through the first switching element SW1. Consequently, the photoelectrons are transferred to the charge discharging unit through the second switching element SW2 and are discharged therefrom.

Further, in the conventional art, a structure is provided (refer to Document 1 noted above) in which photoelectrons from a photoelectric conversion element are allocated respectively to two nodes through separate paths. In such a case, due to the fact that the positions and lengths of the electrodes (gate electrodes) to each of the nodes differ from one another, a difference in the transfer efficiency to each of the nodes occurs, which results in lowering of the S/N ratio, caused by the existence of a distribution in the in-plane conversion efficiency of the photoelectric conversion element, or differences in the transfer paths of the photoelectrons.

Thus, in the first light receiving device 100A, the aforementioned photoelectric conversion element 10 or the second photoelectric conversion element 10B is used as the photoelectric conversion element 10. In this case, because potential gradients 34 are formed in the photoelectric conversion element 10, it becomes possible for the photoelectrons to be transferred at high speeds by electric fields, whereby photoelectrons obtained in the valid period can be transferred to the capacitor Ca through the first switching element SW1. Of course, the photoelectrons can also be transferred at high speeds by using the second photoelectric conversion element 10B as the photoelectric conversion element 10.

Accordingly, the first light receiving device 100A can be applied to applications in which it is required to obtain a high S/N ratio, and is suitable, for example, for cases in which the light receiving area is large and/or the distance to nodes from where the photoelectrons are output is long. In addition, because charges are accumulated in one charge accumulating unit 26, and the capacitor Ca and the charge discharging unit 108 are arranged at symmetrical positions with respect to the center of the charge accumulating unit 26, even in the event that photoelectrons are allocated to two or more nodes, the transfer paths of the electrons are the same, and thus differences do not occur in the transfer efficiency to each of the nodes.

[Second Light Receiving Device 100B]

Figure 7:
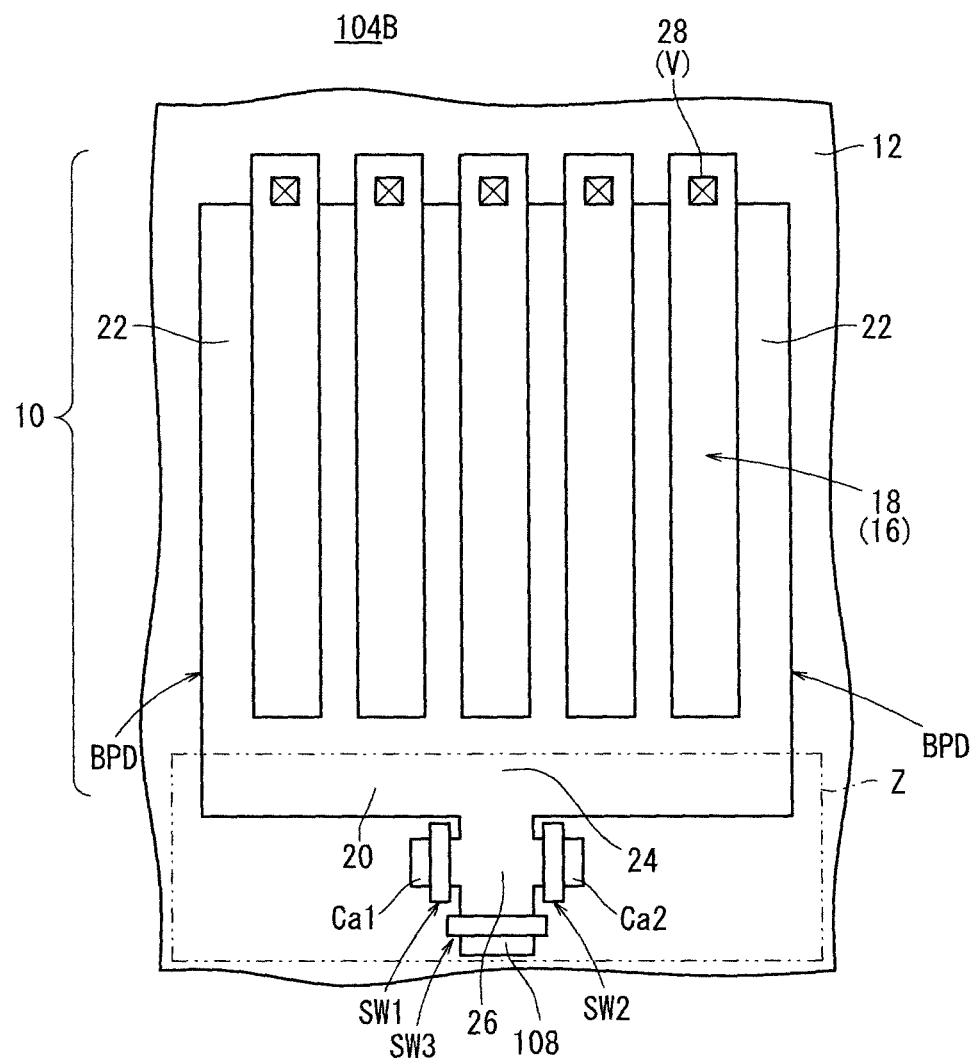
FIG. 7 is a view showing a second light receiving unit of a second light receiving device as seen from an upper surface thereof.

Next, a light receiving device (hereinafter referred to as a second light receiving device 100B) according to the second embodiment shall be explained with reference to FIGS. 5 and 7.

As shown in FIG. 5, the second light receiving device 100B, similar to the aforementioned first light receiving device 100A, comprises a lens 102 and a second light receiving unit 104B.

The second light receiving unit 104B has roughly the same structure as that of the aforementioned first light receiving unit 104A of the first light receiving device 100A. However, as shown in FIG. 7, the second light receiving unit 104B differs therefrom in that a first capacitor Ca1 and a second capacitor Ca2 are included for storing photoelectrons respectively in predetermined time periods.

More specifically, the charge discharging unit 108 is arranged to confront the photoelectric conversion element 10 while sandwiching the charge accumulating unit 26 therebetween, whereas the first capacitor Ca1 and the second capacitor Ca2 are arranged to confront each other mutually while sandwiching the charge accumulating unit 26 therebetween. In the present embodiment, in particular, the first capacitor Ca1 and the second capacitor Ca2 are disposed at symmetrical positions with respect to the center of the charge accumulating unit 26.

Further, there are provided a first switching element SW1 disposed between the charge accumulating unit 26 and the first capacitor Ca1 for causing photoelectrons accumulated in the charge accumulating unit 26 to migrate to the first capacitor Ca1, a second switching element SW2 disposed between the charge accumulating unit 26 and the second capacitor Ca2 for causing photoelectrons accumulated in the charge accumulating unit 26 to migrate to the second capacitor Ca2, and a third switching element SW3 disposed between the charge accumulating unit 26 and the charge discharging unit 108 for controlling discharge of photoelectrons from the charge accumulating unit 26 to the charge discharging unit 108.

The first capacitor Ca1 and the second capacitor Ca2 are constituted by one of a MIM capacitor, a MOS capacitor, an embedded photodiode structure, or a pn junction parasitic capacitance.

The first switching element SW1 includes a MOS structure constituted by a gate electrode disposed between the charge accumulating unit 26 and the first capacitor Ca1, an insulator body under the gate electrode, and the semiconductor substrate 12 under the insulator body. The second switching element SW2 includes a MOS structure constituted by a gate electrode disposed between the charge accumulating unit 26 and the second capacitor Ca2, an insulator body under the gate electrode, and the semiconductor substrate 12 under the insulator body. The third switching element SW3 includes a MOS structure constituted by a gate electrode disposed between the charge accumulating unit 26 and the charge discharging unit 108, an insulator body under the gate electrode, and the semiconductor substrate 12 under the insulator body. Accordingly, the first through third switching elements SW1 to SW3 are turned ON by applying a high level voltage to the gate electrodes thereof, and are turned OFF by applying a low level voltage (which may be a zero level voltage 0V or a negative voltage) to the gate electrodes thereof.

At least the charge accumulating unit 26, the first capacitor Ca1, the second capacitor Ca2, and the first through third switching elements SW1 to SW3 are formed in a light shielded region Z.

The second light receiving device 100B is advantageous in that, due to the fact that the first capacitor Ca1 and the second capacitor Ca2 are included therein, noise from ambient light can be removed from the obtained luminance information.

More specifically, light, which is incident in a period (hereinafter referred to as a "first valid period") during which it is desired to acquire as noise information luminance information of ambient light, is converted to photoelectrons in the photoelectric conversion element 10, and such photoelectrons are transferred at high speeds and accumulated in the charge accumulating unit 26 in accordance with the above operations. Thereafter, by turning ON the first switching element SW1, the photoelectrons in the charge accumulating unit 26 are transferred to the first capacitor Ca1, and luminance information of ambient light is obtained based on the amount (charge amount) of photoelectrons that have been transferred to the first capacitor Ca1. Then, the first switching element SW1 is turned OFF after passage of a predetermined time period.

Next, light, which is incident in a period (hereinafter referred to as a "second valid period") during which it is desired to acquire luminance information of specified incident light La, is converted to photoelectrons in the photoelectric conversion element 10, and such photoelectrons are transferred at high speeds and accumulated in the charge accumulating unit 26 in accordance with the above operations. Thereafter, by turning ON the second switching element SW2, the photoelectrons in the charge accumulating unit 26 are transferred to the second capacitor Ca2, and luminance information of specified incident light La is obtained based on the amount (charge amount) of photoelectrons that have been transferred to the second capacitor Ca2. Then, the second switching element SW2 is turned OFF after passage of a predetermined time period. Because noise information due to ambient light is included within the obtained luminance information of the specified incident light, luminance information from which noise caused by ambient light has been removed can be obtained, by subtracting therefrom the luminance information of the ambient light obtained through the first capacitor Ca1.

On the other hand, light which is incident outside of the first valid period and the second valid period also is converted into photoelectrons in the photoelectric conversion element 10, and such photoelectrons are transferred at high speeds and accumulated in the charge accumulating unit 26 in accordance with the above operations. Therefore, by turning ON the third switching element SW3, the photoelectrons in the charge accumulating unit 26 are transferred to the charge discharging unit 108 and are discharged therefrom.

Since the photoelectric conversion element 10 or the second photoelectric conversion element 10B may also be used as the photoelectric conversion element 10 in the second light receiving device 100B, photoelectrons obtained in the first valid period can be transferred at high speeds to the first capacitor Ca1 through the first switching element SW1, and photoelectrons obtained in the second valid period can be transferred at high speeds to the second capacitor Ca2 through the second switching element SW2. In addition, the first capacitor Ca1 and the second capacitor Ca2 are arranged at symmetrical positions with respect to the center of the charge accumulating unit 26.

Accordingly, in the second light receiving device 100B as well, the same effects as those of the first light receiving device 100A are offered. Furthermore, since noise components due to ambient light can be removed, luminance information of specified incident light La can be acquired highly accurately, and the S/N ratio can be improved.

[First Light Receiving System 200A]

Next, a light receiving system (hereinafter referred to as a first light receiving system 200A) according to a first embodiment shall be described with reference to FIGS. 8 through 10.

Figure 8:
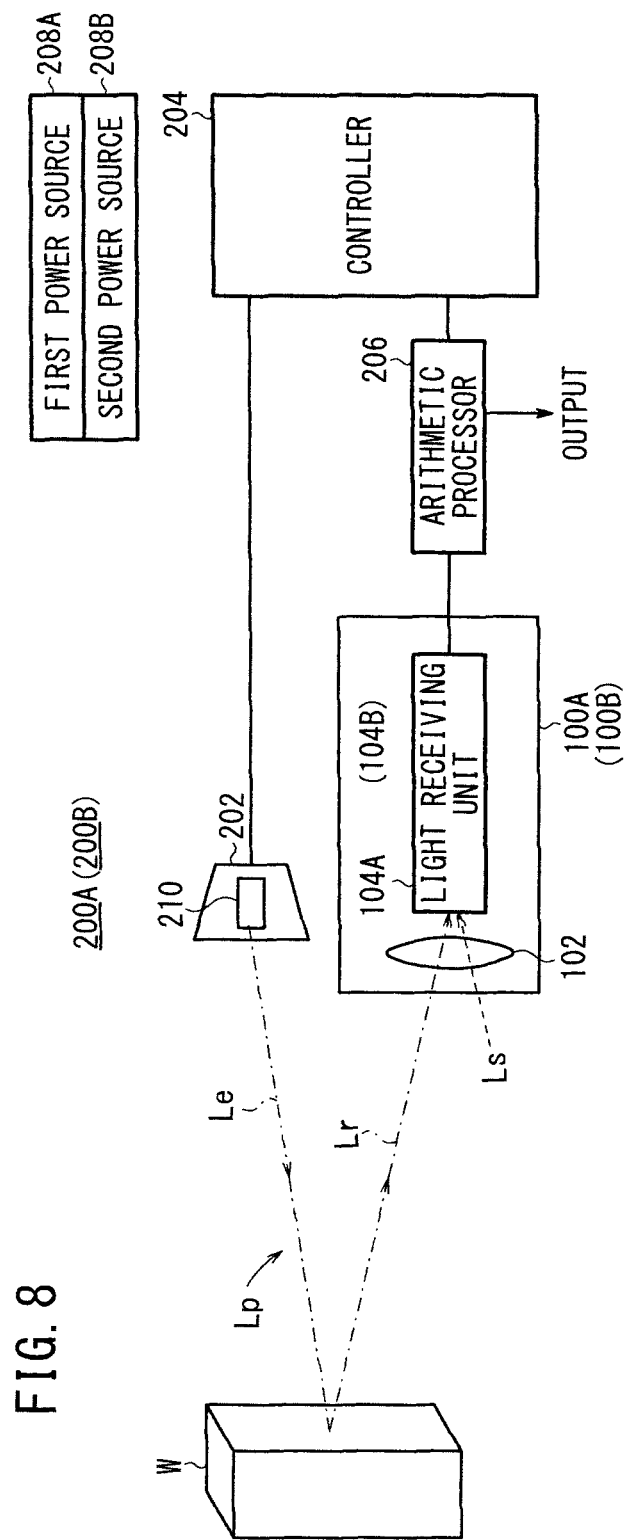
FIG. 8 is a schematic diagram showing features of a first light receiving system and a second light receiving system.

As shown in FIG. 8, the first light receiving system 200A includes a light emitting device 202, the aforementioned first light receiving device 100A, a controller 204, an arithmetic processor 206, and a first power supply 208A and a second power supply 208B for supplying predetermined power source voltages to the light emitting device 202, the first light receiving device 100A, the controller 204, and the arithmetic processor 206. For simplicity, in FIG. 8, display of power source lines to each of the devices from the first power supply 208A and the second power supply 208B have been omitted.

In the first light receiving system 200A, pulsed light Lp that is emitted from the light emitting device 202 is reflected by an object W, and is made incident on the first light receiving device 100A. To facilitate explanations, the pulsed light Lp from the light emitting device 202 up to the object W shall be referred to as radiant light Le, and the pulsed light from the object W up to the first light receiving device 100A shall be referred to as reflected light Lr.

The controller 204 carries out a control to acquire components of reflected light Lr from the object W, from the light that is received by the light receiving device 100A.

<Light Emitting Device 202>

The light emitting device 202 includes a light emitter 210 that outputs pulsed light based on a command from the controller 204. In the first light receiving system 200A, the light emitter 210 of the light emitting device 202 comprises stacked (serially connected) semiconductor laser bars, made up of light emission points (emitters) disposed in a linear form, which enable surface light emission therefrom.

The light emitter 210 is capable of irradiating infrared light having a wavelength of 870 nanometers [nm] at an output power of 100 watts [W]. Further, within each cycle Cm (periods in which measurement values are determined), an exposure process (electric charge accumulating process) is carried out multiple times (see FIG. 19). Assuming that the period of the exposure process (refer to the second accumulating period Tca2 in FIG. 19) is 100 microseconds, the light emitter 210 outputs pulsed light Lp for an output time (pulse width) of 100 nanoseconds. Stated otherwise, the light emitter 210 is driven at a 0.1% duty ratio.

The light emitter 210 may include a linear array of light emission points, or may include a plurality of light emission points, which are arrayed in a matrix form. As the light emitting element, a laser diode, a light emitting diode (LED), etc., or other types of light emitting elements may be used. Further, the pulsed light Lp that is irradiated from the light emitter 210 may be of another wavelength, for example, a wavelength longer than 700 nm and shorter than or equal to 1050 nm. Furthermore, the output of the light emitter 210 may be of a value other than as described above, for example, a value greater than 20 W and less than or equal to 10 kW. Still further, the pulse width of the pulsed light Lp may be of another length, for example, a length greater than or equal to 10 nanoseconds and less than or equal to 1 millisecond. In addition, the duty ratio at which the light emitter 210 is driven may be of a different value, for example, a value greater than or equal to 0.01% and less than or equal to 1%.

<First Light Receiving Device 100A>

Since the first light receiving device 100A has already been described above, multiple descriptions thereof are omitted, however, the first light receiving device 100A, and in particular the first light receiving unit 104A, shall now be explained with reference to FIG. 9, in terms of the circuit structure thereof.

Figure 9:
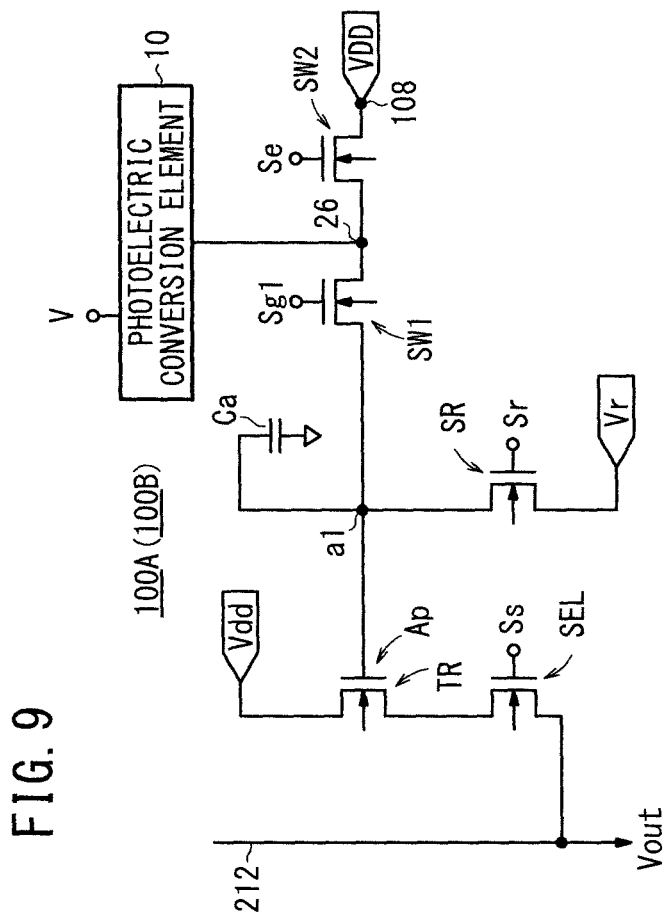
FIG. 9 is a circuit diagram showing a first light receiving unit of the first light receiving system.

More specifically, as shown in FIG. 9, the first light receiving unit 104A comprises the aforementioned photoelectric conversion element 10, the charge accumulating unit 26, the capacitor Ca, the charge discharging unit 108, the first switching element SW1, and the second switching element SW2, while additionally including a reset switch SR and an amplifier AP.

(First Switching Element SW1, Capacitor Ca)

The first switching element SW1 is constituted, for example, by an n-channel MOS transistor, with the source being connected to the charge accumulating unit 26, the drain being connected to the capacitor Ca, and the gate being connected to a non-illustrated gate drive circuit. Accordingly, by selectively controlling ON/OFF states of the first switching element corresponding to a gate drive signal (readout signal Sg) from the gate drive circuit being applied with respect to the gate, the photoelectrons residing in the charge accumulating unit 26 are transferred to the capacitor Ca.

(Second Switching Element SW2, Charge Discharging Unit 108)

The second switching element SW2 is constituted, for example, by an n-channel MOS transistor, with the source being connected to the charge accumulating unit 26, the drain being connected to the charge discharging unit 108, and a positive power source voltage Vdd from the first power source 208A being supplied to the charge discharging unit 108. Further, a non-illustrated gate drive circuit is connected to the gate. Accordingly, by supplying a gate drive signal (charge discharging signal Se) from the gate drive circuit to the gate (i.e., by making the voltage supplied to the gate a high level), the gate is turned ON, whereby photoelectrons residing in the charge accumulating unit 26 are discharged through the charge discharging unit 108 without being transferred to the capacitor Ca.

(Reset Switch SR)

The reset switch SR is constituted by an re-channel MOS transistor, with a contact point between the first switching element SW1 and the capacitor Ca being connected to the source, and a reset voltage Vr from the second power source 208B being supplied to the drain. Further, a non-illustrated gate drive circuit is connected to the gate. Accordingly, by turning ON the reset switch SR as a result of the gate drive circuit supplying a drive signal (reset signal Sr) to the gate, the potential of the capacitor Ca can be set to a constant reset potential. In other words, the capacitor Ca can be reset.

(Amplifier AP)

The amplifier AP includes an output element TR constituted, for example, by an n-channel MOS transistor, and an output switch SEL made up, for example, from an n-channel MOS transistor, which is connected between a source of the output element TR and an output line 212. A contact point a1 between the first switching element SW1 and the capacitor Ca is connected to the gate of the output element TR, a power source voltage Vdd from the first power source 208A is supplied to the drain, and a drain of the output switch SEL is connected to the source of the output element TR. A non-illustrated gate drive circuit is connected to the gate of the output switch SEL, and the output line 212 is connected to the source of the output switch SEL.

Accordingly, by turning ON the output switch SEL by supplying a gate drive signal (output selection signal Ss) from the gate drive circuit with respect to the gate of the output switch SEL, a voltage corresponding to the photoelectrons (charge amount Q) stored in the capacitor Ca is amplified in the output element TR and is retrieved as an output voltage Vout.

<Operations of the First Light Receiving System 200A>

Next, operations of the first light receiving system 200A will be explained with reference to FIG. 10. In FIG. 10, V is shown as a voltage, which is applied to the electrode 16 of the photoelectric conversion element 10. The light emission time of pulsed light Lp from the light emitting device 202 is designated by WL, whereas time periods during which the first switching element SW1 and the second switching element SW2 are turned ON are designated respectively by WD1, WD2.

At first, the controller 204 of the first light receiving system 200A drives the light emitting device 202 at each of fixed periods (cycles), such that within each cycle, the pulsed light Lp is irradiated for a light emission time WL. Pulsed light Lp (radiant light Le) that is radiated out from the light emitting device is reflected by the object W, and is made incident on the first light receiving device 100A as reflected light Lr. The light incident on the first light receiving device 100A is converted into photoelectrons by the photoelectric conversion element 10, which are transmitted at high speeds to the charge accumulating unit 26.

The first switching element SW1 transfers the photoelectrons that were transferred to the charge accumulating unit 26 to the capacitor Ca. More specifically, photoelectrons transferred to the capacitor Ca are photoelectrons (charge amount Q) obtained through photoelectric conversion of the reflected light Lr. Accordingly, information regarding the intensity of the reflected light can be acquired by means of the charge amount Q.

Further, in the event that the first switching element SW1 is not turned ON, the photoelectrically converted photoelectrons are regarded as unnecessary photoelectrons, and thus by turning ON the second switching element, such unnecessary photoelectrons are discharged to the charge discharging unit 108.

Detailed operation timings of the first light receiving system 200A are explained with reference to FIG. 10.

First, initial settings of the first light receiving system 200A are preformed, the second switching element SW2 and the reset switch SR are both turned ON, and the first switching element SW1 and the output switch SEL are both turned OFF. Owing thereto, unnecessary photoelectrons stored in the photoelectric conversion element 10 are discharged, together with setting the potential of the capacitor Ca to the reset potential Vr. Thereafter, the reset switch SR is turned OFF.

After initial settings are completed, the cycle is performed only one time, or alternatively is repeated a plurality of times, in order to acquire the reflected light intensity.

Figure 10:
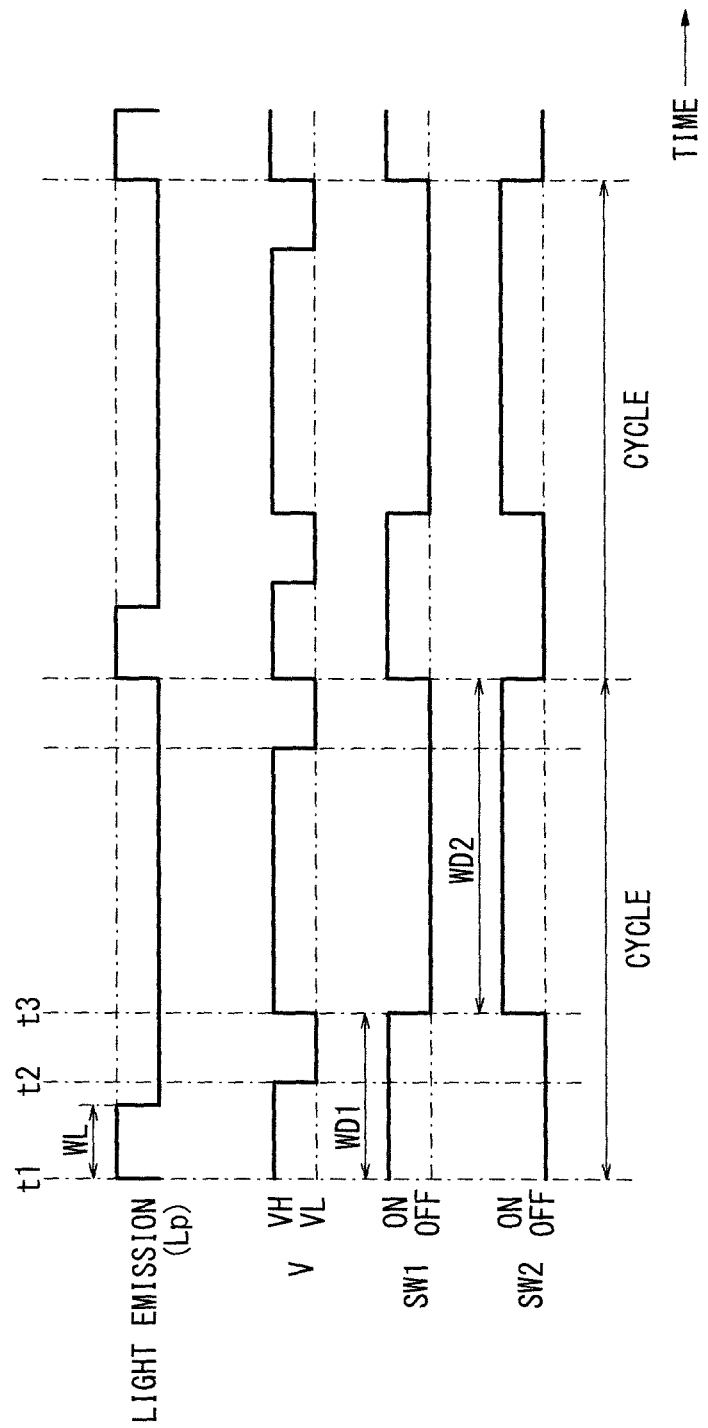
FIG. 10 is a timing chart showing operations of the first light receiving system.

As shown in FIG. 10, in each cycle, at an initial time t1, one light pulse Lp is irradiated from the light emitting device 202 in accordance with driving of the light emitting device 202 by the controller 204. Thus, at time t1, the second switching element SW2 is turned OFF, whereas the first switching element SW1 is turned ON (while the second switching element SW2 remains OFF) from time t1 and through the readout time period WD1. Further, from time t1, the voltage V, which are supplied to the electrode 16 of the photoelectric conversion element 10, are set to high level VH. Owing thereto, the photoelectrons obtained through photoelectric conversion by the photoelectric conversion element 10 become accumulated underneath the electrode 16, and a portion of the photoelectrons migrate to the charge accumulating unit 26, and further are transferred through the first switching element SW1 to the capacitor Ca. After the irradiation time period WL of the pulsed light Lp has transpired, at the second time t2, the voltage becomes a low level VL, so that in accordance with the potential gradient 34 formed thereby, the photoelectrons beneath the electrode 16 are transferred at high speeds to the embedded photodiode BPD, while being transferred to the charge accumulating unit 26, and transferred to the capacitor Ca through the first switching element SW1.

Thereafter, at time t3, the first switching element SW1 is turned OFF, and from time t3 and over a time period (charge discharging period WD2) until initiation of the next cycle, the second switching element SW2 is turned ON (while the first switching element SW1 remains OFF). Owing thereto, unnecessary photoelectrons that were generated in the photoelectric conversion element 10 during the charge discharging period WD2 are discharged through the second switching element SW2 and the charge discharging unit 108. Also in the charge discharging period WD2, the voltage V supplied to the electrode 16 of the photoelectric conversion element 10 are controlled in a similar manner as during the period WD1, whereby photoelectrons generated by the photoelectric conversion element 10 including the electrode 16 are discharged through the charge discharging unit 108, so that no charges remain in the photoelectric conversion element 10.

At a stage after completion of a predetermined number of cycles, by turning ON the output switch SEL, in the output line 212, a voltage corresponding to the photoelectrons (charge amount) stored in the capacitor Ca is amplified in the output element TR and is output as an output voltage Vout. The output voltage Vout is digitally converted into by a non-illustrated A/D converter, and then is supplied to the arithmetic processor 206.

[Second Light Receiving System 200B]

Next, a light receiving system (hereinafter referred to as a second light receiving system 200B) according to a second embodiment shall be described with reference to FIGS. 8 and 11 through 15.

The second light receiving system 200B has substantially the same structure as the aforementioned first light receiving system 200A, however as shown in FIG. 8, the second light receiving system 200B differs therefrom in that the second light receiving device 100B is used, such that a control is carried out by the controller 204 to remove components of ambient light Ls received by the second light receiving device 100B, and to acquire components of reflected light Lr from the object W, whereby information of the reflected light intensity, which is not dependent on ambient light Ls, can be obtained.

<Basic Principles for Reducing the Influence of Ambient Light Ls>

Basic principles for reducing the influence of ambient light Ls, and in particular, basic principles in the case of using continuous light, will be described below with reference to FIGS. 11 through 13B.

First, as shown in FIG. 11, within an initial one frame period F1, photoelectrons are taken in at a time in which continuous light is not irradiated on the object W, and a luminance value from the photoelectrons during a non-irradiated time is acquired. In the next two frame period F2, photoelectrons are taken in at a time in which continuous light is irradiated on the object W, and a luminance value from the photoelectrons during an irradiation time is acquired. Then, by obtaining a difference in the luminance values thereof, the influence of ambient light (mainly light components from sunlight) can be reduced. In the case that one cycle is made up by combining the first frame period F1 and the second frame period F2, the duty ratio of continuous light with respect to the one cycle is 50%. Further, as one frame period, 1/60 seconds is used, which represents the image sensing period by an imaging device.

Additionally, in the initial one frame period F1, light is received without irradiating continuous light, whereas in the following second frame period F2, due to the fact that light is received while continuous light is irradiated over the second frame period F2, noise components caused by ambient light also are taken in over the first frame period F1 and the second frame period F2.

Figure 12A:
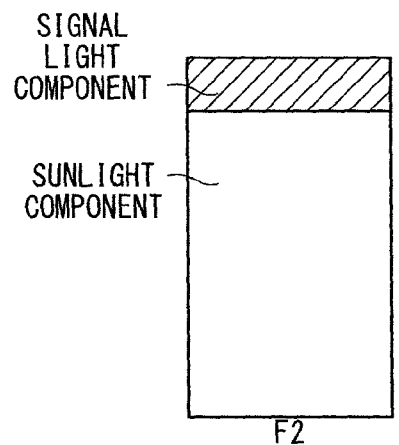
FIG. 12A is an explanatory diagram showing fundamental principles of a technique for reducing the influence of ambient light.

Accordingly, as shown in FIG. 12A, the luminance value (sunlight component) of the first frame period F1 is subtracted from the luminance value (signal component+sunlight component) of the second frame period F2, to thereby ideally eliminate the influence of the sunlight component, and to acquire only the signal component.

Figure 12B:
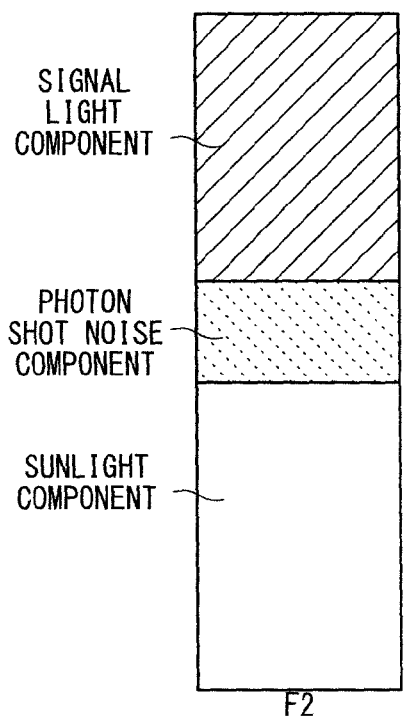
FIG. 12B is an explanatory diagram showing an influence from photon shot noise of sunlight.

However, in an environment in which there exists intense ambient light such as sunlight, there also is an effect of photon shot noise, and in addition, due to the fact that such photon shot noise is of a random nature, the influence of ambient light cannot sufficiently be removed merely by calculating the difference in the aforementioned luminance values. More specifically, as shown in FIG. 12B, in the case that a photon shot noise component, which is generated in the first frame period F1, differs from the photon shot noise component generated in the second frame period F2, the difference therebetween will be superimposed on the signal component.

Figure 13A:
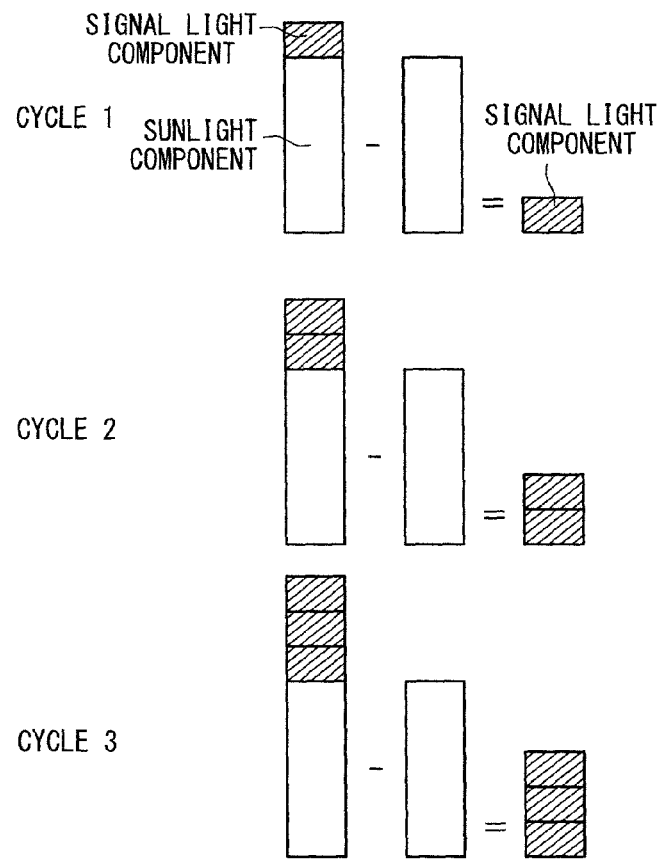
FIG. 13A is an explanatory diagram showing a method of repeating the cycle shown in FIG. 17A multiple times for thereby enhancing the S/N ratio.
Figure 13B:
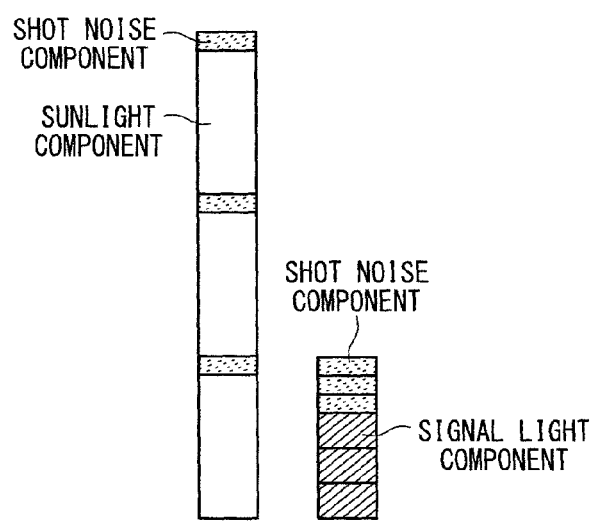
FIG. 13B is an explanatory diagram showing an influence from random photon shot noise.

Further, in an environment in which there exists intense ambient light such as sunlight, for example as shown in FIG. 12A, due to the fact that the sunlight component is greater than the signal component (i.e., the S/N ratio of the signal component is low), a problem occurs in that the input dynamic range of the signal component is small. In a general imaging element, the valid region (dynamic range) of output signals with respect to the incident light amount is limited, such that when sunlight is irradiated or made incident, it is recognized that adverse effects are caused, such as the signal output becoming saturated. Consequently, for example as shown in FIG. 13A, one cycle (i.e., operations of exposure during the one frame period F1 and the two frame period F2, and subtracting the luminance value (sunlight component) of the first frame period F1 from the luminance value (signal component+sunlight component) of the second frame period F2) is repeated multiple times, and signal components are accumulated, whereby it is thought that the S/N ratio of the signal component can be improved. However, as noted above (see FIG. 12B), in each of the frame periods, random photon shot noise is inserted, and additionally, in the difference calculation as well, such random photon shot noise partially remains. Therefore, as shown in FIG. 13B, a problem occurs in that signal components are accumulated, and together therewith, remaining noise components also are accumulated, such that after the difference calculation, the S/N ratio is disadvantageously reduced.

In order to improve the S/N ratio of the signal component, it may be considered to increase the power of the continuous light. However, due to the fact that continuous light is irradiated over one frame period, a new problem results in that generation of heat and power consumption tends to increase. Although concerning heat generation, a cooling mechanism, for example, can be separately provided in response thereto, additional problems occur in that manufacturing costs and running costs for the light receiving system become higher, and the size of the light receiving system becomes large. Accordingly, there is a limit to how much the power of the continuous light can be increased.

On the other hand, with the aforementioned light emitting device 202, because pulsed light Lp of a short pulse width and having a high output is irradiated from the light emitter 210, in the second light receiving system 200B in which the light emitting device 202 is used, the various problems caused by continuous light, as mentioned above, can be resolved.

[Details of the Second Light Receiving System 200B]

<Light Emitting Device 202>

The light emitting device 202 has substantially the same structure as the light emitting device 202 of the first light receiving system 200A, and therefore explanations thereof will be omitted.

<Second Light Receiving Device 100B>

Since the second light receiving device 100B has already been discussed above (see FIG. 7), repeated explanations thereof are omitted. However, using FIG. 14, the second light receiving device 100B shall be explained in terms of the circuit structure thereof.

Figure 14:
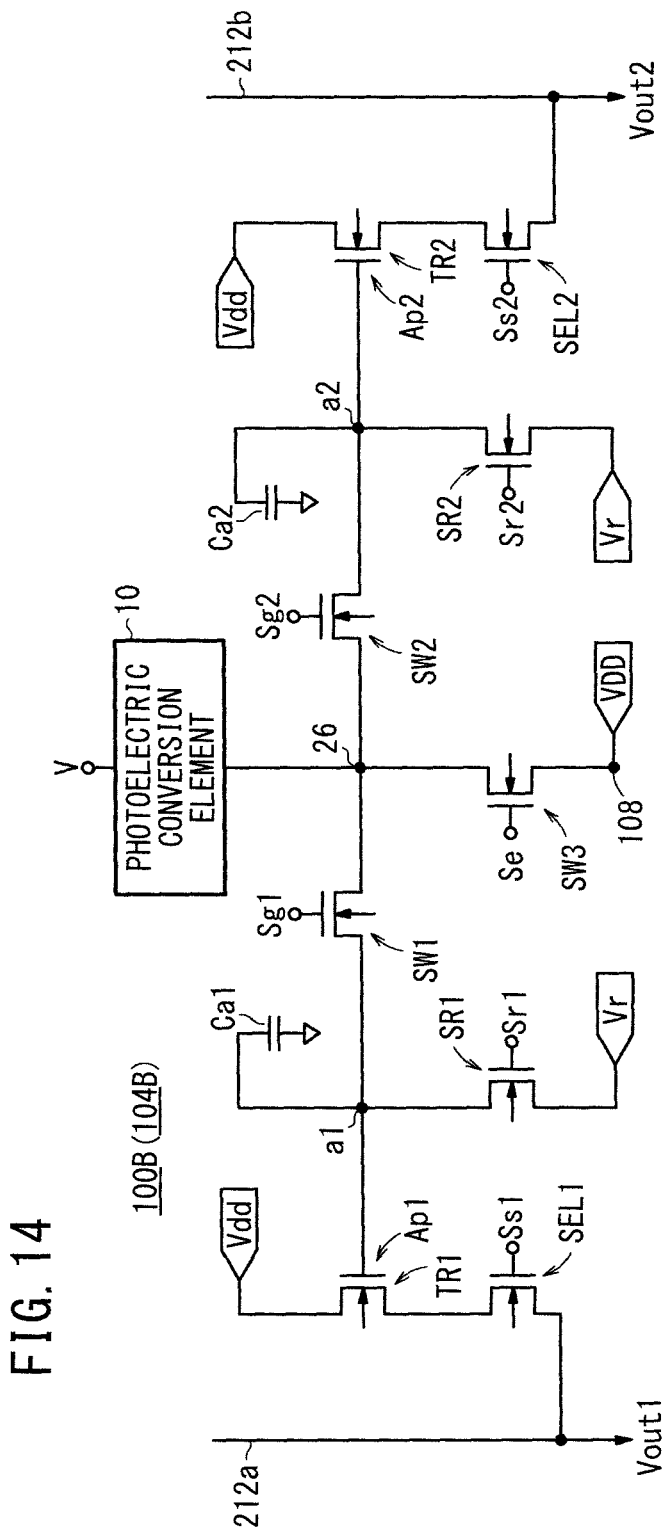
FIG. 14 is a circuit diagram showing a second light receiving unit of a second light receiving system.

More specifically, as shown in FIG. 14, the second light receiving device 100B comprises the aforementioned photoelectric conversion element 10, the charge accumulating unit 26, a first capacitor Ca1, a second capacitor Ca2, the charge discharging unit 108, and first through third switching elements SW1 to SW3, and furthermore, includes a first reset switch SR1, a second reset switch SR2, a first amplifier AP1, and a second amplifier AP2.

(First Switching Element SW1, First Capacitor Ca1)

The first switching element SW1 is constituted, for example, by an n-channel MOS transistor, with the charge accumulating unit 26 being connected to the source, the drain being connected to the first capacitor C1, and the gate being connected to a non-illustrated gate drive circuit. Accordingly, a control is performed to selectively turn the first switching element SW1 ON and OFF corresponding to a gate drive signal (first readout signal Sg1) from the gate drive circuit with respect to the gate, whereby photoelectrons that reside in the charge accumulating unit 26 are transferred to the first capacitor Ca1.

(Second Switching Element SW2, Second Capacitor Ca2)

The second switching element SW2 is constituted, for example, by an n-channel MOS transistor, with the source being connected to the charge accumulating unit 26, the drain being connected to the second capacitor Ca2, and the gate being connected to a non-illustrated gate drive circuit. Accordingly, by selectively controlling turning ON and OFF of the second switching element SW2 corresponding to a gate drive signal (second readout signal Sg2) from the gate drive circuit with respect to the gate, photoelectrons that reside in the charge accumulating unit 26 are transferred to the second capacitor Ca2.

(Third Switching Element SW3, Charge Discharging Unit 108)

The third switching element SW3 is constituted, for example, by an n-channel MOS transistor, with the source being connected to the charge accumulating unit 26, the drain being connected to the charge discharging unit 108, and a positive power source voltage Vdd from the first power supply 208A being supplied to the charge discharging unit 108. Further, a non-illustrated gate drive circuit is connected to the gate. Accordingly, by supplying a gate drive signal (charge discharging signal Se) to the gate from the gate drive circuit, the gate is turned ON, and photoelectrons that reside in the charge accumulating unit 26 are discharged through the charge discharging unit 108, without being transferred to the first capacitor Ca1 or the second capacitor Ca2.

(First Reset Switch SR1, Second Reset Switch SR2)

The first reset switch SR1 and the second reset switch SR2 are constituted, for example, by n-channel MOS transistors. A contact point a1 between the first switching element SW1 and the first capacitor C1 is connected to the source of the first reset switch SR1, and a contact point a2 between the second switching element SW2 and the second capacitor C2 is connected to the source of the second reset switch SR2. A reset voltage Vr from the second power source 208B is supplied to each of the drains, and a non-illustrated gate drive circuit is connected to each of the gates. Thus, in accordance with gate drive signals (first reset signal Sr1 and second reset signal) from the gate drive circuit with respect to each of the gates, the first reset switch SR1 and the second reset switch SR2 are selectively or simultaneously turned ON, whereby potentials of the first capacitor Ca1 and the second capacitor Ca2 can be set at fixed reset potentials. More specifically, the first capacitor Ca1 and the second capacitor Ca2 can be reset.

(First Amplifier AP1)

The first amplifier AP1 includes a first output element TR1 constituted, for example, by an n-channel MOS transistor, and a first output switch SEL1 made up, for example, from an n-channel MOS transistor, which is connected between a source of the first output element TR1 and a first output line 212a. A contact point a1 between the first switching element SW1 and the first capacitor Ca1 is connected to the gate of the first output element TR1, a positive power source voltage Vdd from the first power source 208A is supplied to the drain, and a drain of the first output switch SEL1 is connected to the source. A non-illustrated gate drive circuit is connected to the gate, and the first output line 212a is connected to the source of the first output switch SEM. Accordingly, by turning ON the first output switch SEL1 by supplying a gate drive signal (first output selection signal Ss1) with respect to the first output switch SEL1, a voltage corresponding to the photoelectrons (charge amount Q1) stored in the first capacitor Ca1 is amplified in the first output element TR1 and is retrieved as a first output voltage Vout1.

(Second Amplifier AP2)

The second amplifier AP2 includes a second output element TR2 constituted, for example, by an n-channel MOS transistor, and a second output switch SEL2 made up, for example, from an n-channel MOS transistor, which is connected between a source of the second output element TR2 and a second output line 212b. A contact point a2 between the second switching element SW2 and the second capacitor Ca2 is connected to the gate of the second output element TR2, a positive power source voltage Vdd from the first power source 208A is supplied to the drain, and a drain of the second output switch SEL2 is connected to the source. A non-illustrated gate drive circuit is connected to the gate, and the second output line 212b is connected to the source of the second output switch SEL2. Accordingly, by turning ON the second output switch SEL2 by supplying a gate drive signal (second output selection signal Ss2) with respect to the gate of the second output switch SEL2, a voltage corresponding to the photoelectrons (charge amount Q2) stored in the second capacitor Ca2 is amplified in the second output element TR2 and is retrieved as a second output voltage Vout2.

<Operations of the Second Light Receiving System 200B>

Figure 15:
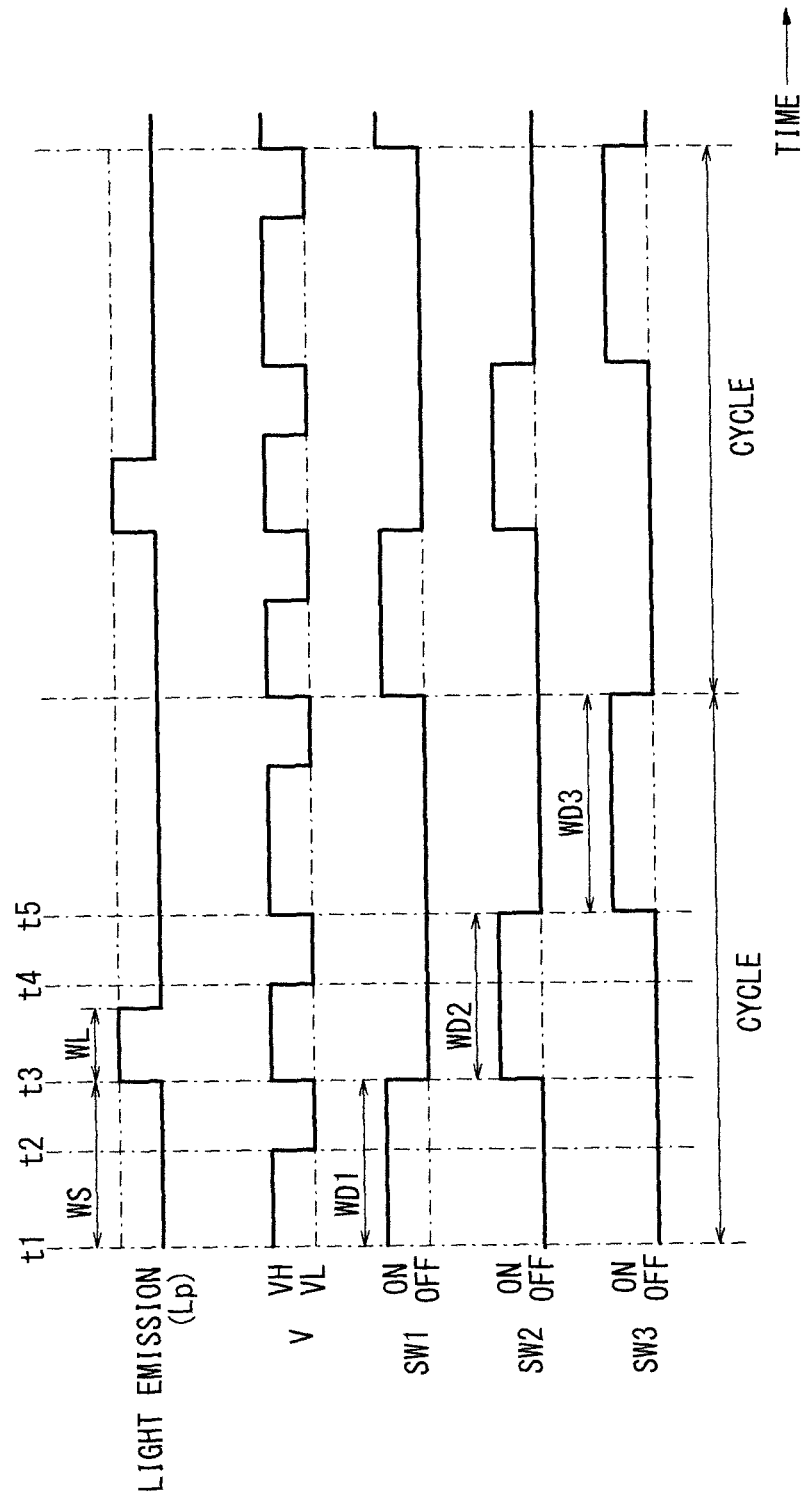
FIG. 15 is a timing chart showing operations of the second light receiving system.
Figure 20:
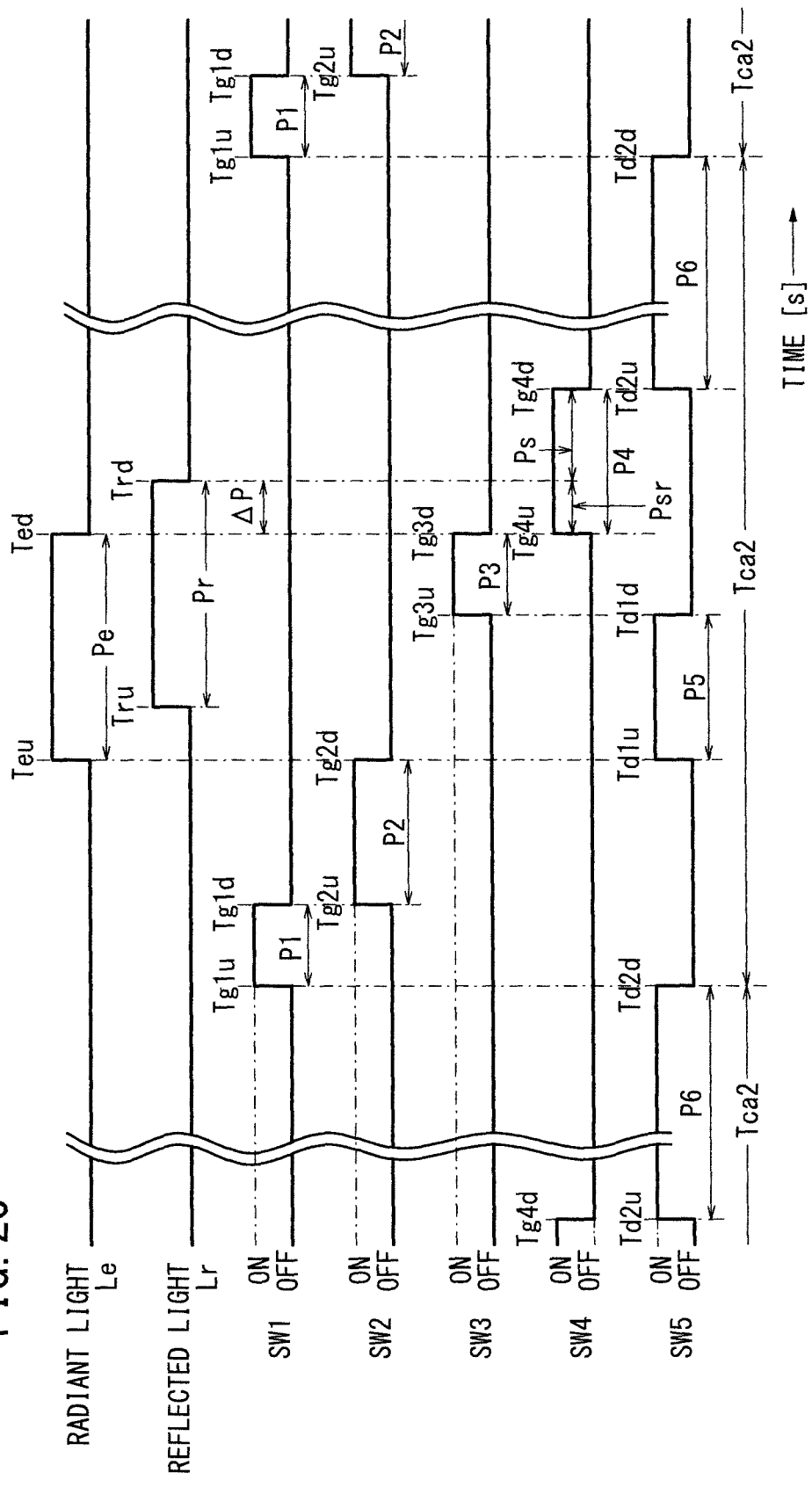
FIG. 20 is a timing chart showing an example of radiant light, reflected light, and ON/OFF timings of first through fifth switching elements within each of respective second accumulation periods Tca2.

Next, operations of the second light receiving system 200B will be explained with reference to FIG. 15. In FIG. 20, periods during which the first through third switching elements SW1 to SW3 are turned ON are designated respectively by WD1 to WD3.

At first, the controller 204 of the second light receiving system 200B drives the light emitting device 202 at each of fixed periods (cycles), such that within a fixed period WS, the pulsed light Lp is irradiated for a light emission time WL in each cycle. The fixed period WS is a period during which luminance information of ambient light Ls is readout, and in the fixed period WS thereof, light that is incident on the second light receiving device 100B is converted into photoelectrons by the photoelectric conversion element 10, and the photoelectrons are transferred at high speeds to the charge accumulating unit 26.

The first switching element SW1 transfers the photoelectrons that were transferred to the charge accumulating unit 26 to the first capacitor Ca1. More specifically, photoelectrons transferred to the first capacitor Ca1 are photoelectrons (charge amount Q1) obtained through photoelectric conversion of the incident ambient light Ls. Accordingly, information regarding the intensity of ambient light can be acquired by means of the charge amount Q1.

After passage of the fixed period WS, pulsed light Lp (radiant light Le) irradiated from the light emitting device 202 is reflected by the object W, and is made incident on the second light receiving device 100B as reflected light Lr. The light incident on the second light receiving device 100B is converted into photoelectrons by the photoelectric conversion element 10, and the photoelectrons are transferred at high speeds to the charge accumulating unit 26.

The second switching element SW2 transfers the photoelectrons, which were transferred to the charge accumulating unit 26, to the second capacitor Ca2. More specifically, the photoelectrons transferred to the second capacitor Ca2 are photoelectrons (charge amount Q2) obtained through photoelectric conversion of incident ambient light Ls and reflected light Lr (i.e., reflected light made up of pulsed light Lp that is reflected by the object W).

Consequently, as shown by the following equation (F1), by taking the difference between the charge amount Q1 and the charge amount Q2, information of the reflected light intensity, which is not dependent on ambient light, can be obtained.

$$\text{Reflected Light Intensity} = Q1 - Q2 \tag{F1}$$

In the event that the first switching element SW1 and the second switching element SW2 are both not ON (both are OFF), the photoelectrons converted through photoelectric conversion are unnecessary photoelectrons, and therefore, such unnecessary photoelectrons are discharged to the charge discharging unit 108 by turning ON the third switching element SW3.

Detailed operation timings of the second light receiving system 200B are explained with reference to FIG. 15.

Initially, similar to the aforementioned first light receiving system 200A, initial settings for the second light receiving system 200B are preformed, the third switching element SW3, the first reset switch SR1, and the second reset switch SR2 are all turned ON, and the first switching element SW1, the second switching element SW2, the first output switch SEL1, and the second output switch SEL2 are all turned OFF. Owing thereto, unnecessary photoelectrons stored in the photoelectric conversion element 10 are discharged, together with setting respective potentials of the first capacitor Ca1 and the second capacitor Ca2 to the reset potential. Thereafter, the first reset switch SR1 and the second reset switch SR2 are turned OFF. Further, simultaneously, the voltage V supplied to the electrode 16 of the photoelectric conversion element 10 is controlled at the illustrated timings and by similar operations during the period WD3 of FIG. 15, whereby photoelectrons generated by the photoelectric conversion element 10 including the electrode 16 are discharged through the charge discharging unit 108, so that charges do not remain in the photoelectric conversion element 10, and the photoelectric conversion element 10 is initialized.

After initial settings are completed, the cycle is performed only one time, or alternatively is repeated a plurality of times, in order to acquire the reflected light intensity.

As shown in FIG. 20, different from the case of the first light receiving system 200A, in each of the cycles, a fixed period WS is placed from the initial time t1, and as a result of the controller 204 driving the light emitting device 202, one unit of pulsed light Lp is irradiated from the light emitting device 202. Accordingly, the fixed period WS serves as a time period during which ambient light Ls is taken in.

In addition, at time t1, the third switching element is turned OFF, whereas the first switching element SW1 is turned ON (while the second switching element SW2 and the third switching element SW3 remain OFF) from time t1 and across the first reading period WD1. Further, similar to the aforementioned first light receiving system 200A, from time t1, the voltage V supplied to the electrode 16 of the photoelectric conversion element 10 is set at high level VH, and thereafter, at time t2, the voltage V is set at the low level VL, and thereafter. In accordance with such a serial voltage change, the photoelectrons beneath the electrodes 16 are transferred at high speeds to the embedded photodiode, while being transferred to the charge accumulating unit 26, and then the photoelectrons are transferred to the first capacitor Ca1 through the first switching element SW1.

Thereafter, at time t3, the first switching element SW1 is turned OFF, together with one unit of pulsed light Lp being irradiated from the light emitting device 202. Further, the second switching element SW2 is turned ON (while the first switching element SW1 and the third switching element SW3 remain OFF) from time t3 and across the second reading period WD2. Further, from time t3, the voltage V supplied to the electrode 16 of the photoelectric conversion element 10 is set at high level VH, and thereafter, at time t4, the voltage V is set at the low level VL. In accordance with such a serial voltage change, the photoelectrons beneath the second electrode 16 are transferred at high speeds to the embedded photodiode BPD, while being transferred at high speeds to the charge accumulating unit 26, and then the photoelectrons are transferred to the second capacitor Ca2 through the second switching element SW2.

Thereafter, at time t5, the second switching element SW2 is turned OFF, and the third switching element SW3 is turned ON (while the first switching element SW1 and the second switching element SW2 both remain OFF) from a period (charge discharging period WD3) from time t5 until the start of the next cycle. In accordance therewith, in the charge discharging period WD3, unnecessary photoelectrons generated in the photoelectric conversion element 10 are discharged via the third switching element SW3 and the charge discharging unit 108.

At a stage following completion of a predetermined number of cycles, by turning ON the first output switch SEL1, in the first output line 212a, a voltage corresponding to the photoelectrons (charge amount Q1) stored in the first capacitor Ca1 is amplified in the first output element TR1, and is output as the first output voltage Vout1. Thereafter, by turning ON the second output switch SEL2, to the second output line 212b, a voltage corresponding to the photoelectrons (charge amount Q2) stored in the second capacitor Ca2 amplified in the second output element TR2 is output as the second output voltage Vout2.

The first output voltage Vout1 and the second output voltage Vout2 output from the first output line 212a and the second output line 212b are converted respectively into first numerical data D1 and second numerical data D2 by a non-illustrated A/D converter, and the numerical data are supplied to the arithmetic processor 206.

In the arithmetic processor 206, reflected light intensity data Dr are obtained by performing a calculation in accordance with the following equation (F2) based on the supplied first numerical data D1 and the second numerical data D2.

$$Dr = D2 - D1 \tag{F2}$$

Because the pulse width of the pulsed light Lp is longer than 1 nanosecond and less than 0.25 seconds, the aforementioned light emitting device 202 is capable of setting the pulse width of the pulsed light Lp to a length which timewise is equal to or less than 1%, for example, equal to or less than 0.1%, of one frame. In other words, from the fact that the pulse width can be set quite short, the power of the one unit of pulsed light can be made higher, thereby enabling the S/N ratio of the reflected light component with respect to the ambient light component to be greatly improved. The second reading period WD2 can also be set short along with the pulse width of the pulsed light Lp, while additionally, the first reading period WD1 in which only ambient light Ls is read can be set to the same length timewise as the aforementioned second reading period WD2, and thus, since the reading time is made short, the amount of incident ambient light Ls can be reduced, and photon shot noise components caused by such ambient light Ls can also be reduced.

Further, the length of time between the first reading period WD1 and the second reading period WD2 can be made substantially zero, and therefore, switching between reading of photoelectrons during the period (first reading period WD1) in which pulsed light Lp is not irradiated on the object (i.e., acquisition of luminance values during non-irradiation), and reading of photoelectrons during the period (second reading period WD2) while pulsed light Lp is irradiated (i.e., acquisition of luminance values during irradiation) can be carried out in a short time, whereby simultaneity in relation to the acquisition of the luminance values during non-irradiation and the luminance values during irradiation can be significantly improved.

Further, in the event that the aforementioned cycle is repeated multiple times, the amount of photoelectrons stored in the first capacitor Ca1 and the second capacitor Ca2 can be increased. In this case as well, due to the fact that the duty ratio of pulsed light Lp with respect to the pulse period of the string of pulsed light is set to 1% or less (e.g., 0.1% or less), the power of each of the units of pulsed light Lp included within the string of pulsed light can be made higher than that of continuous light, and the S/N ratio of reflected light Lr (signal light component) with respect to ambient light (noise component) in each pulse width can be significantly improved. In this manner, by making the duty ratio of the pulsed light Lp small, even if pulsed light having a large output is used, because heat can be released while emission of light is at rest, a favorable heat dissipation characteristic is enabled. In addition, due to the fact that photoelectrons are stored respectively in the first capacitor Ca1 and the second capacitor Ca2 over a plurality of cycles, the signal light component can be increased, and the accuracy of subsequent signal processing thereof can be enhanced. Further, since within each cycle, switching between reading of photoelectrons in the first reading period WD1 and reading of photoelectrons in the second reading period WD2 can be performed in a short time, simultaneity in relation to acquisition of luminance values during non-irradiation and luminance values during irradiation can be significantly improved.

[First Distance Measuring Device 300A]

Next, a distance measuring device (hereinafter referred to as a first distance measuring device 300A) according to a first embodiment shall be described with reference to FIGS. 16 through 21.

The first distance measuring device 300A serves to acquire a three dimensional image in which a measured distance is used based on outputs of respective pixels 304 of a later-described image sensor 302, and includes a third light receiving device 100C, in addition to the aforementioned light emitting device 202, the controller 204, the arithmetic processor 206, the first power source 208A, and the second power source 208B.

With the first distance measuring device 300A, pulsed light Lp, which is irradiated from a light emitter 210 of the light emitting device 202 in response to a command from the controller 204, is reflected by an object W, and is made incident on the third light receiving device 100C. Ambient light Ls from sunlight or the like is also incident on the third light receiving device 100C. The third light receiving device 100C outputs a signal to the arithmetic processor 206 indicative of a charge that corresponds to a received light amount based on a command from the controller 204. The arithmetic processor 206 calculates a time period (round-trip time period $\Delta P$) [s] required for the pulsed light Lp to arrive at the third light receiving device 100C from the light emitting device 202, and based on the round-trip time period $\Delta P$, calculates a distance D [m] between the first distance measuring device 300A and the object W. The calculation result of the arithmetic processor 206 is output to a non-illustrated display device.

<Third Light Receiving Device 100C>

The third light receiving device 100C includes a lens 102 and a third light receiving unit 104C. Reflected light Lr that passes through the lens 102 and ambient light Ls are focused onto the third light receiving unit 104C. The lens 102 may also comprise a plurality of lenses, which are arrayed in a line or in a matrix.

Figure 17:
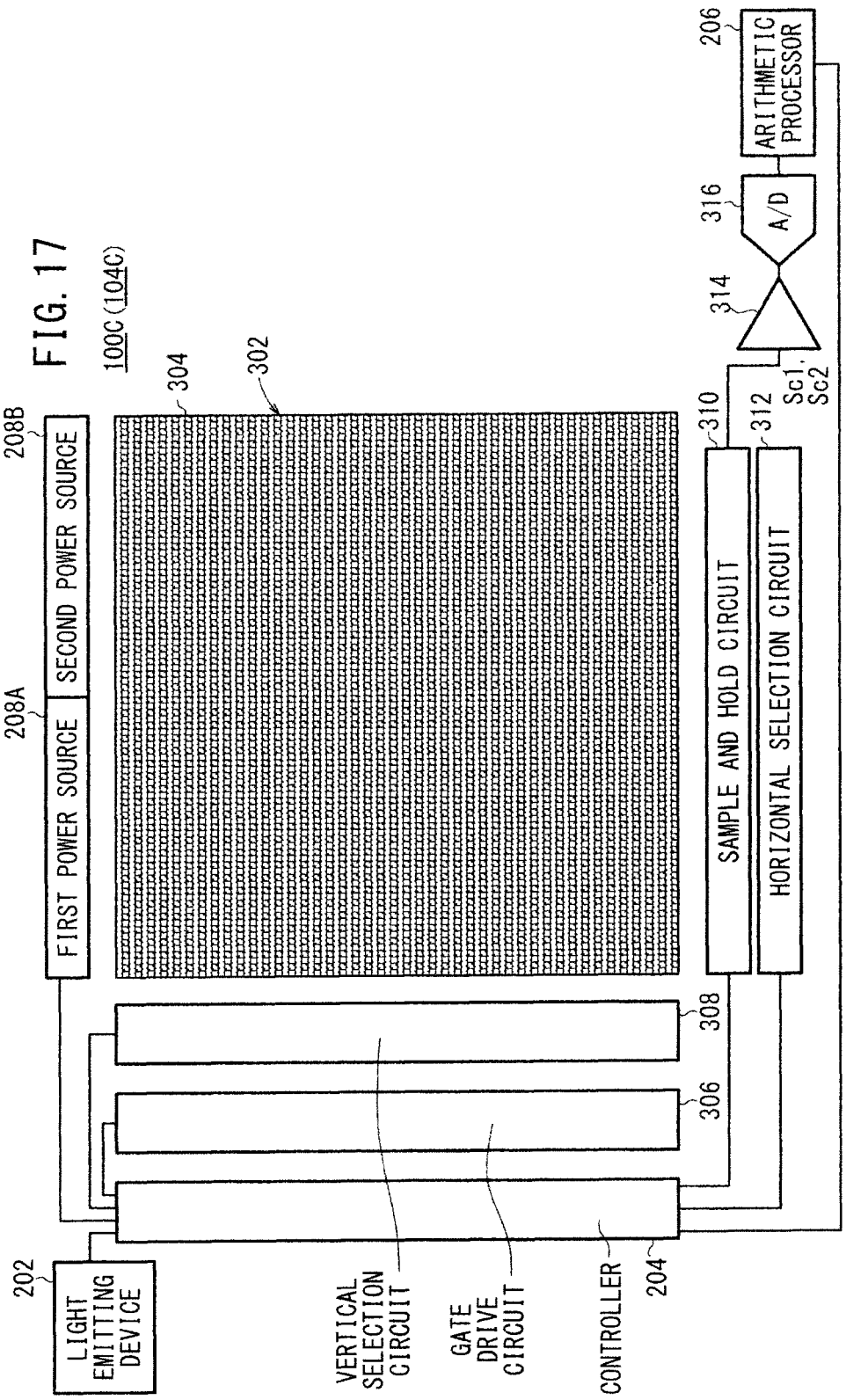
FIG. 17 is a schematic diagram showing a third light receiving unit having a sensor array of a third light receiving device in the first distance measuring device.

As shown in FIG. 17, the third light receiving unit 104C includes an image sensor 302 in which pixels 304 are arranged in a matrix form, a gate drive circuit 306, a vertical selection circuit 308, a sample and hold circuit 310, a horizontal selection circuit 312, an output buffer 314, and an A/D converter 316.

The image sensor 302 outputs via the horizontal selection circuit 312 accumulated charge signals Sc1, Sc2 corresponding to the amount of light received by each of the pixels 304. The first power source 208A applies a positive power source voltage Vdd with respect to the image sensor 302, and the second power source 208B applies a reset voltage Vr with respect to the image sensor 302.

The gate drive circuit 306 controls ON/OFF states of first through fifth switching elements SW1 to SW5 (see FIG. 18), and of first through fourth reset switches SR1 to SR4 of the image sensor 302, by outputting various types of gate drive signals.

The vertical selection circuit 308 includes a multiplexer (not shown), selectively outputs first through fourth output selection signals Ss1 to Ss4 with respect to rows to which pixels 304 belong that are to be read, and further outputs accumulated charge signals Sc1, Sc2 from the pixels 304. The horizontal selection circuit 312 includes another multiplexer (not shown) for selecting columns to which pixels 304 belong that are to be read.

Figure 18:
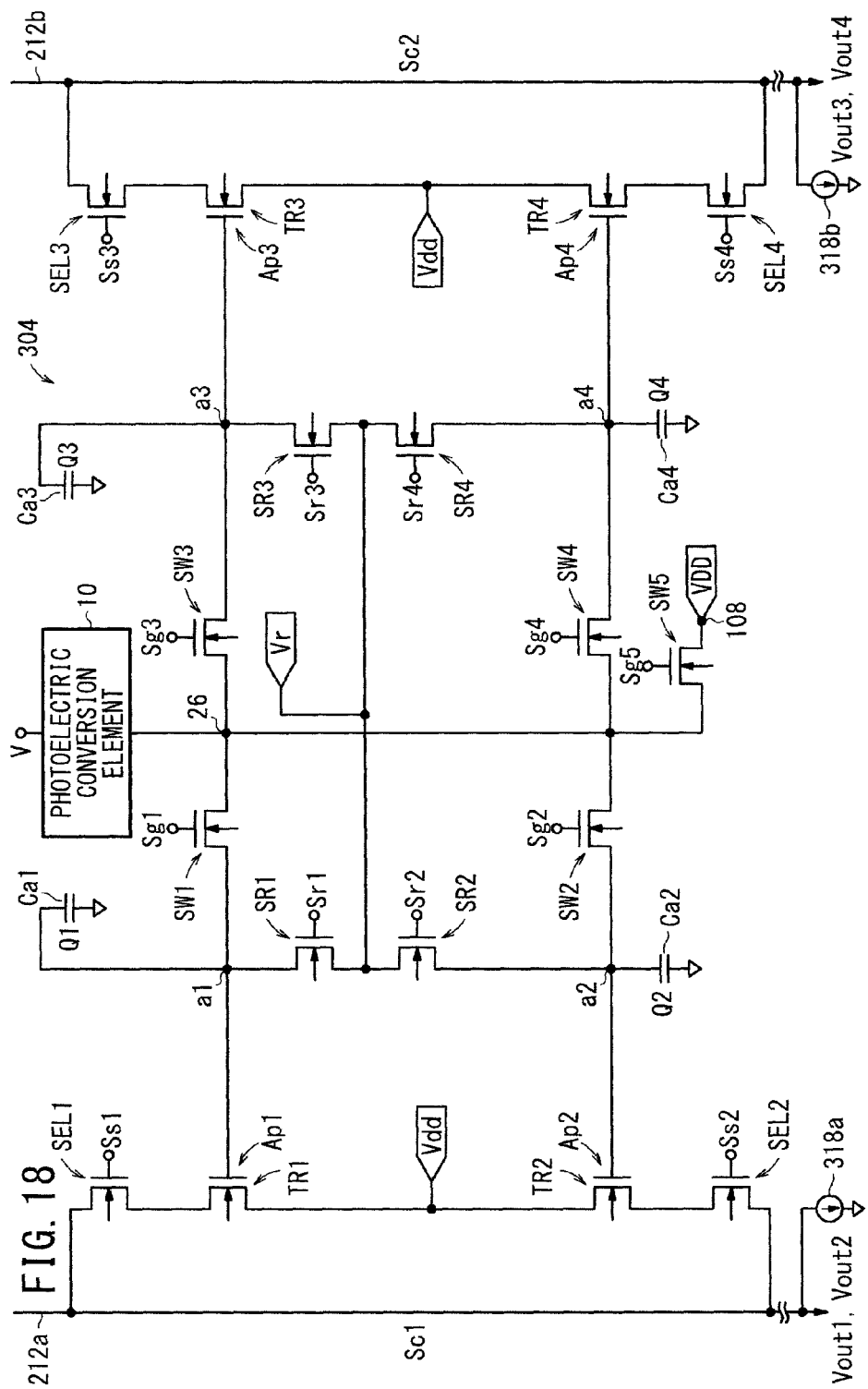
FIG. 18 is a circuit diagram showing the structure of respective pixels of the third light receiving unit.

As shown in FIG. 18, the accumulated charge signals Sc1, Sc2 read out from the pixels 304 are converted into first and second output voltages Vout1, Vout2 by a first fixed current circuit 58a, and into third and fourth output voltages Vout3, Vout4 by a second fixed current circuit 58b, and after having been accumulated once in the sample and hold circuit 310, are output from the horizontal selection circuit 312. In addition, the accumulated charge signals Sc1, Sc2 are transmitted to the arithmetic processor 206 through the output buffer 314 and the A/D converter 316. The arithmetic processor 206, which has received the accumulated charge signals Sc1, Sc2, determines a light amount (light amount Ar) of the reflected light Lr from the accumulated charge signals Sc1, Sc2, and calculates the distance D between the first distance measuring device 300A and the object W (to be described in detail later).

<Pixels 304>

In FIG. 18, a circuit diagram of one pixel 304 is shown. As shown in FIG. 18, the pixel 304 is equipped with the aforementioned photoelectric conversion element 10, the charge accumulating unit 26, first through fourth capacitors Ca1 to Ca4, the charge discharging unit 108, and first through fifth switching elements SW1 to SW5, and further includes first through fourth reset switches SR1 to SR4 and first through fourth amplifiers AP1 to AP4. In FIG. 18, so that the circuit diagram may be seen more easily, the charge accumulating unit 26 is shown by two contact points, however, in actuality the contact points are constituted together in one charge accumulating unit 26. Further, the first capacitor Ca1 and the third capacitor Ca3 are disposed at symmetrical positions with respect to the center of the charge accumulating unit 26, and the second capacitor Ca2 and the fourth capacitor Ca4 also are disposed at symmetrical positions with respect to the center of the charge accumulating unit 26. Similarly, the first capacitor Ca1 and the second capacitor Ca2 are disposed at symmetrical positions with respect to the center of the charge accumulating unit 26, and the third capacitor Ca3 and the fourth capacitor Ca4 also are disposed at symmetrical positions with respect to the center of the charge accumulating unit 26.

(First Switching Element SW1, First Capacitor Ca1)

The first switching element SW1 and the first capacitor Ca1 have the same structure as those of the aforementioned second light receiving device 100B, and therefore, explanations of these features are omitted.

(Second Switching Element, Second Capacitor)

The second switching element SW2 and the second capacitor Ca2 have the same structure as those of the aforementioned second light receiving device 100B, and therefore, explanations of these features are omitted.

(Third Switching Element SW3, Third Capacitor Ca3)

The third switching element is constituted, for example, by an n-channel MOS transistor, with the source connected to the charge accumulating unit 26, the drain connected to the third capacitor Ca3, and the gate connected to the gate drive circuit 306. Accordingly, ON and OFF states of the third switching element SW3 are selectively controlled corresponding to a gate drive signal (third readout signal Sg3) from the gate drive circuit 306 with respect to the gate, whereby photoelectrons residing in the charge accumulating unit 26 are transferred to the third capacitor Ca3.

(Fourth Switching Element SW4, Fourth Capacitor Ca4)

The fourth switching element SW4 is constituted, for example, by an n-channel MOS transistor, with the source connected to the charge accumulating unit 26, the drain connected to the fourth capacitor C1, and the gate connected to the gate drive circuit 306. Accordingly, ON and OFF states of the fourth switching element SW4 are selectively controlled corresponding to a gate drive signal (fourth readout signal Sg4) from the gate drive circuit 306 with respect to the gate, whereby photoelectrons residing in the charge accumulating unit 26 are transferred to the fourth capacitor Ca4.

(Fifth Switching Element SW5, Charge Discharging Unit 108)

The fifth switching element SW5 is constituted, for example, by an n-channel MOS transistor, with the charge accumulating unit 26 being connected to the source, the charge discharging unit 108 being connected to the drain, and a positive power source voltage Vdd being supplied from the first power source 208A to the charge discharging unit 108. Further, a charge discharging signal Se is supplied to the gate from the gate drive circuit 306.

Accordingly, by supplying the charge discharging signal Se to the gate (i.e., by making the voltage supplied to the gate high in level), the gate is turned ON, and unnecessary photoelectrons residing in the charge accumulating unit 26 are discharged through the charge discharging unit 108 without being transferred to the first through fourth capacitors Ca1 to Ca4.

More specifically, when all of the first through fourth switching elements SW1 to SW4 are turned OFF (i.e., when the photoelectrons generated by the photoelectric conversion element 10 are not allocated to the first through fourth capacitors Ca1 to Ca4), by transmitting the charge discharging signal Se from the gate drive circuit 306 to the fifth switching element SW5 (i.e., by making the voltage supplied to the gate high in level), the fifth switching element SW5 is turned ON, and unnecessary photoelectrons generated by the photoelectric conversion element 10 can be discharged through the charge discharging unit 108 without being allocated to the first through fourth capacitors Ca1 to Ca4. Owing thereto, it becomes possible for only photoelectrons generated by the photoelectric conversion element 10 to be allocated during periods when the first through fourth switching elements SW1 to SW4 are turned ON. As a result, by a method to be described later, the distance D between the first distance measuring device 300A and the object W can be measured.

(First through Fourth Reset Switches SR1 to SR4)

The first through fourth reset switches SR1 to SR4 are constituted, for example, by n-channel MOS transistors. A contact point a1 between the first switching element SW1 and the first capacitor Ca1 is connected to the source of the first reset switch SR1, and a contact point a2 between the second switching element SW2 and the second capacitor Ca2 is connected to the source of the second reset switch SR2. Similarly, a contact point a3 between the third switching element SW3 and the third capacitor Ca3 is connected to the source of the third reset switch SR3, and a contact point a4 between the fourth switching element SW4 and the fourth capacitor Ca4 is connected to the source of the fourth reset switch SR4. A reset voltage Vr from the second power supply 208B is supplied to each of the drains, and the gate drive circuit 306 is connected to each of the gates.

Accordingly, by the gate drive signals (first through fourth resetting signals Sr1 to Sr4) being supplied from the gate drive circuit 306 with respect to each of the gates, the first through fourth reset switches SR1 to SR4 are turned ON selectively or simultaneously, whereby potentials of the first through fourth capacitors Ca1 to Ca4 can be set respectively to fixed reset potentials. Stated otherwise, the first through fourth capacitors Ca1 to Ca4 can be reset.

(First Amplifier AP1, Second Amplifier AP2)

The first amplifier AP1 and the second amplifier AP2 have the same structure as those of the first amplifier AP1 and the second amplifier AP2 of the above-described second light receiving device 100B, and therefore detailed descriptions thereof are omitted. However, the source of the first output switch SEL1 of the first amplifier AP1 is connected to the first output line 212a, and the first output selection signal Ss1 is supplied to the gate thereof from the vertical selection circuit 308. Similarly, the source of the second output switch SEL2 of the second amplifier AP2 is connected to the first output line 212a, and the second output selection signal Ss2 is supplied to the gate thereof from the vertical selection circuit 308.

Accordingly, by turning ON the first output switch SEL1 in accordance with the first output selection signal Ss1 being supplied with respect to the gate of the first output switch SEL1, a voltage corresponding to the photoelectrons (charge amount Q1) stored in the first capacitor Ca1 is amplified in the first output element TR1, and is extracted as a first output voltage Vout1 via the first output line 212a. Similarly, by turning ON the second output switch SEL2 in accordance with the second output selection signal Ss2 being supplied with respect to the gate of the second output switch SEL2, a voltage corresponding to the photoelectrons (charge amount Q2) stored in the second capacitor Ca2 is amplified in the second output element TR2, and is extracted as a second output voltage Vout2 via the first output line 212a.

(Third Amplifier AP3)

The third amplifier AP3 includes a third output element TR3 constituted, for example, by an n-channel MOS transistor, and a third output switch SEL3 made up, for example, from an n-channel MOS transistor, which is connected between a source of the third output element TR3 and the second output line 212b. A contact point a3 between the third switching element SW3 and the third capacitor Ca3 is connected to the gate of the third output element TR3, a positive power source voltage Vdd from the first power source 208A is supplied to the drain, and a drain of the third output switch SEL3 is connected to the source. The third output switch SEL3 is arranged such that the second output line 212b is connected to the source, and a first output selection signal Ss3 from the vertical selection circuit 308 is supplied to the gate.

Accordingly, by turning ON the third output switch SEL3 in accordance with the third output selection signal Ss3 being supplied with respect to the gate of the third output switch SEL3, a voltage corresponding to the photoelectrons (charge amount Q3) stored in the third capacitor Ca3 is amplified in the third output element TR3, and is extracted as a third output voltage Vout3 via the second output line 212b.

(Fourth Amplifier AP4)

The fourth amplifier AP4 includes a fourth output element TR4 constituted, for example, by an n-channel MOS transistor, and a fourth output switch SEL4 made up, for example, from an n-channel MOS transistor, which is connected between a source of the fourth output element TR4 and the second output line 212b. A contact point a4 between the fourth switching element SW4 and the fourth capacitor Ca4 is connected to the gate of the fourth output element TR4, a positive power source voltage Vdd from the first power source 208A is supplied to the drain, and a drain of the fourth output switch SEL4 is connected to the source. The fourth output switch SEL4 is arranged such that the second output line 212b is connected to the source, and a fourth output selection signal Ss4 from the vertical selection circuit 308 is supplied to the gate.

Accordingly, by turning ON the fourth output switch SEL4 in accordance with the fourth output selection signal Ss4 being supplied with respect to the gate of the fourth output switch SEL4, a voltage corresponding to the photoelectrons (charge amount Q4) stored in the fourth capacitor Ca4 is amplified in the fourth output element TR4, and is extracted as a fourth output voltage Vout4 via the second output line 212b.

[Method of Measuring Distance D Between First Distance Measuring Device 300A and Object W]

Next, a method for measuring the distance D between the first distance measuring device 300A and the object W shall be explained.

(1) Cycle Cm

Figure 19:
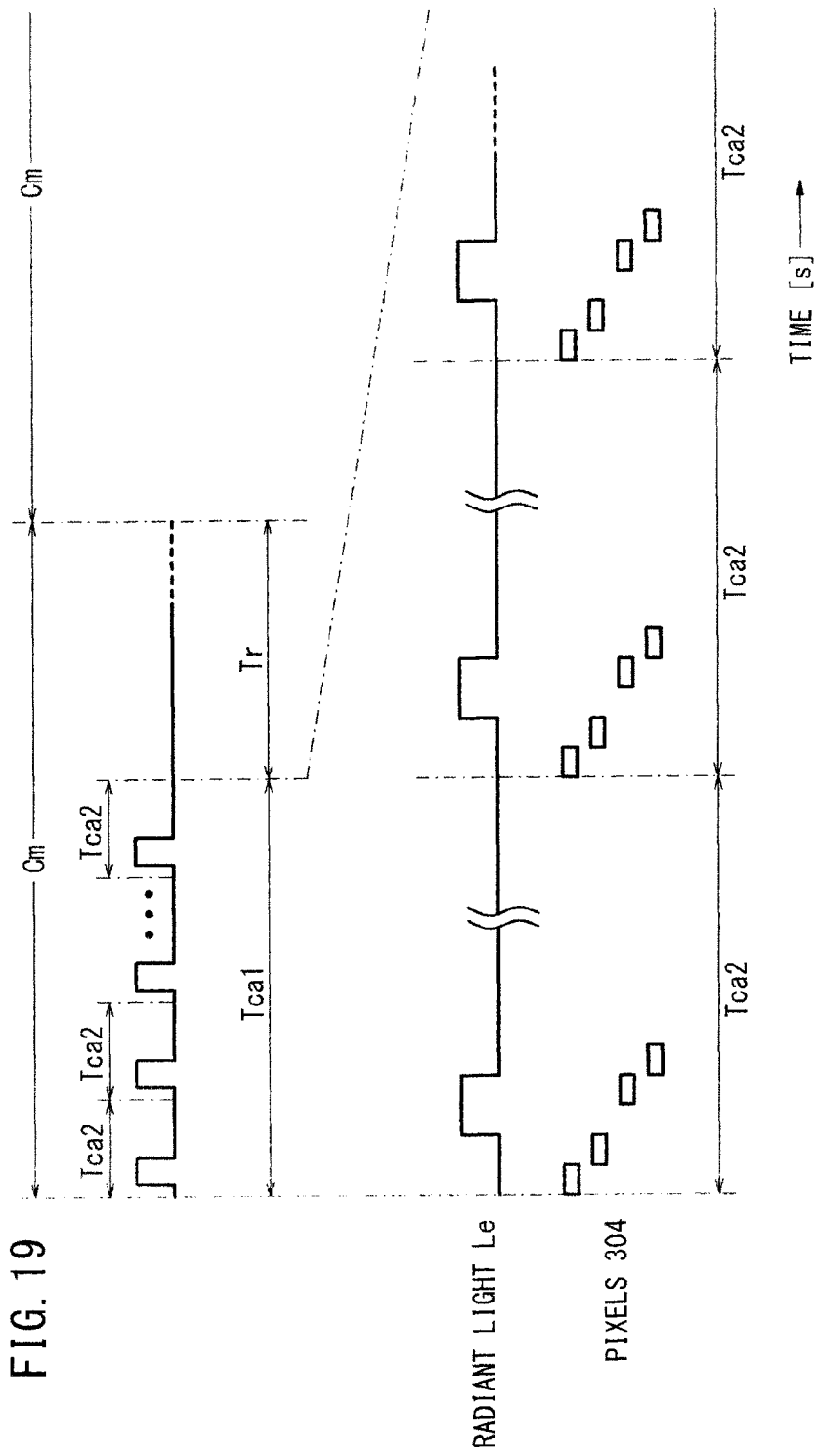
FIG. 19 is a timing chart of a distance measuring cycle.

As shown in FIG. 19, in the first distance measuring device 300A, each cycle (period in which a measurement value is determined) [times/sec] is made up from a first accumulating period Tca1 during which charges in the first through fourth capacitors Ca1 to Ca4 are cumulatively accumulated, and a readout period Tr during which the charges cumulatively stored in the first through fourth capacitors Ca1 to Ca4 are read out. Furthermore, in the first accumulating period Tca1, there are included a plurality of second accumulating periods Tca2 during which pulsed light is exposed to the pixels 304 and processing (charge accumulation processing) is performed one time to accumulate charges in the first through fourth capacitors Ca1 to Ca4. In the first distance measuring device 300A, the first accumulating period Tca1 and the readout period Tr1 are ten milliseconds. Further, each of the second accumulating periods Tca2 is 100 microseconds. Furthermore, the output time (pulse width) of pulsed light Lp in each of the second accumulating periods Tca2 is 100 nanoseconds. Accordingly, the duty ratio at which the light emitter 210 is driven is 0.1% in each of the second accumulating periods Tca2.

As noted above, because the first distance measuring device 300A is capable of outputting the measurement result as a three dimensional image, each of the cycles Cm can be defined as a frame rate [frames/second] of the three dimensional image.

In the first distance measuring device 300A, charge accumulation processing is carried out one hundred times in the first accumulating period Tca1, and together therewith, the round-trip time period ΔP and the distance D are measured based on the charges Q1 to Q4 stored in the first through fourth capacitors Ca1 to Ca4.

(2) Outline of Measurement Method (for One Charge Accumulation Period Tca2)

In the foregoing manner, with the first distance measuring device 300A, although the round-trip time period ΔP and the distance D are measured based on the charges Q1 to Q4 stored in the first through fourth capacitors Ca1 to Ca4 over the entirety of the first accumulating period Tca1, in order to facilitate understanding of the invention, at first, an explanation shall be made below of a case in which the round-trip time period ΔP and the distance D are determined based on the charges Q1 to Q4 stored in the first through fourth capacitors Ca1 to Ca4 over only one of the second accumulating periods Tca2.

In FIG. 20, there is shown a timing chart for radiant light Le and reflected light Lr, together with ON/OFF states of the first through fifth switching elements SW1 to SW5.

Although details thereof shall be described later, with the first distance measuring device 300A, assuming that the intensity Ir [W] of the reflected light Lr is constant, the distance D is measured by using a proportional relation between the period (reflected light incident time period Pri) [s] during which reflected light Lr is incident on the photoelectric conversion element 10, and the cumulative light amount (measured reflected light amount Amr) [J] of reflected light Lr in the reflected light incident time period Pri.

More specifically, in time period P1 as a first standard period, a cumulative light amount (standard ambient light amount Ars) [J] (charge amount Q1 of the first capacitor Ca1) at a time when only ambient light Ls is incident on the photoelectric conversion element 10 is determined, and in time period P3 (=P1) as a second standard period, a cumulative light amount (standard composite light amount Ari) [J] (charge amount Q3 of the third capacitor Ca3) at a time when ambient light Ls and reflected light Lr are both incident on the photoelectric conversion element 10 is determined. Further, in time period P2 as a first measurement period, a cumulative light amount (measured ambient light amount Ams) [J] (charge amount Q2 of the second capacitor Ca2) at a time when only ambient light Ls is incident on the photoelectric conversion element 10 is determined, and in time period P4 (=P2) as a second measurement period, a cumulative light amount (measured composite light amount Ami) [J] (charge amount Q4 of the fourth capacitor Ca4) at a time when ambient light Ls and reflected light Lr are both incident on the photoelectric conversion element 10 is determined. A period (time period Psr) [s] in which both ambient light Ls and reflected light Lr are incident, and a period (time period Ps) [s] in which only ambient light Ls is incident are present within time period P4. Time period Psr is proportional to the distance D to the object W.

The ratio (Ari−Ars:Ami−Ams) of the difference (standard reflected light amount Arr) [J] between the standard composite light amount Ari and the standard ambient light amount Ars and the difference (measured reflected light amount Amr) [J] between the measured composite light amount Ami and the measured ambient light amount Ams is equal to the ratio (P3:Pri) of time period P3 (=P1) and the reflected light incident time period Pri. Using this fact, the time period (round-trip time period ΔP) over which pulsed light Lp irradiated from the first distance measuring device 300A impinges on the object W and until the pulsed light Lp returns to the first distance measuring device 300A is determined. Based on the round-trip time period ΔP, the distance D between the first distance measuring device 300A and the object W is measured.

(3) Details of Measurement Method (for One Second Accumulating Period Tca2)
(a) Description of Timing Chart In FIG. 20, time Teu indicates an irradiation start time of radiant light time Le, Ted indicates an irradiation end time of the radiant light Le, and time period Pe indicates a time period from time Teu until time Ted. Time Tru indicates an incidence start time of reflected light Lr with respect to the photoelectric conversion element 10, time Trd indicates an incidence end time of the reflected light Lr with respect to the photoelectric conversion element 10, and time period Pr indicates a time period from time Tru until time Trd.

Times Tg1u, Tg2u, Tg3u, Tg4u indicate times at which the first through fourth switching elements SW1 to SW4 are turned ON, times Tg1d, Tg2d, Tg3d, Tg4d thereafter indicate times at which the first through fourth switching elements SW1 to SW4 are turned OFF, time period P1 indicates a time period from time Tg1u to time Tg1d, time period P2 indicates a time period from time Tg2u to time Tg2d, time period P3 indicates a time period from time Tg3u to time Tg3d, and time period P4 indicates a time period from time Tg4u to time Tg4d. Time period Psr indicates a time period from time Tg4u to time Trd, and time period Ps indicates a time period from time Trd to time Tg4d.

Times Td1u, Td2u indicate times at which the fifth switching element SW5 is turned ON, times Td1d, Td2d indicate times at which the fifth switching element SW5 is turned OFF, time period P5 indicates a time period from time Td1u to time Td1d, and time period P6 indicates a time period from time Td2u to time Td2d.

While time period Pr during which reflected light is incident on the photoelectric conversion element 10 generates a delay (round-trip time period ΔP) from time Teu to time Tru or from time Ted to time Trd), time period Pr is equal to time period Pe (Pe=Pr) and can be set, for example, between 10 nanoseconds or greater and 1 microsecond or less, and in the first distance measuring device 300A, is set at 100 nanoseconds. Further, in the controller 204, time period P1 and time period P3 as well as time period P2 and time period P4 are set equal to each other respectively (P1=P3 and P2=P4). Time periods P1 and P3, for example, can be set between 10 nanoseconds or greater and 90 nanoseconds or less, and in the first distance measuring device 300A, are set at 30 nanoseconds. Time period P2, for example, can be set between 10 nanoseconds or greater and 90 nanoseconds or less, and in the first distance measuring device 300A, is set at 70 nanoseconds. Further, time period P5, for example, can be set between 0 nanoseconds or greater and 90 nanoseconds or less, and in the first distance measuring device 300A, is set at 70 nanoseconds. Time period P6, for example, can be set between 10 nanoseconds or greater and 1 millisecond or less, and in the first distance measuring device 300A, is set at 100 microseconds. Therefore, among time periods P1 to P6, time period P6 is considerably long.

As can be understood from FIG. 20, at the second accumulating period Tca2 of the first distance measuring device 300A, at first, the first switching element SW1 is turned ON (time period P1), and simultaneously with turning OFF of the first switching element SW1, the second switching element SW2 is turned ON (time period P2). Then, simultaneously with turning OFF of the second switching element SW2, radiant light Le is irradiated with respect to the object W, and the fifth switching element SW5 is turned ON (time period P5). During output of radiant light Le (time period Pe), incidence of reflected light Lr with respect to the photoelectric conversion element 10 is started (at time Tru). After passage of time period P5 from the irradiation start time of the radiant light Le (time Teu), the fifth switching element SW5 is turned OFF, and together therewith, the third switching element SW3 is turned ON (time period P3). Then, after passage of time period Pe, emission of radiant light Le is stopped, and together therewith, the third switching element SW3 is turned OFF, and the fourth switching element SW4 is turned ON (time period P4). At a time during which the fourth switching element SW4 is ON (time period P4), incidence of reflected light with respect to the photoelectric conversion element 10 is stopped (time Trd). Stated otherwise, time period P4 defines the measurement range (range of distances for which measurement is possible) [m] of the first distance measuring device 300A. Simultaneously with turning OFF of the fourth switching element SW4, the fifth switching element SW5 is turned ON (time period P6). Upon passage of time period P6, the fifth switching element SW5 is turned OFF, and one cycle of the second accumulating period Tca2 comes to an end (time Td2d). Simultaneously therewith, a next second accumulating period Tca2 is started, and the first switching element SW1 is turned ON (time Tg1u). Controls for both the third receiving device 100C and the light emitting device 202 are carried out in the controller 204. Further, in the case that the controller 204 is fabricated by a semiconductor process, from the viewpoint of temperature compensation, etc., preferably the controller 204 is fabricated together with the third light receiving unit 104C on the same silicon substrate by means of a CMOS process.

(b) Description of Measurement Principles
(i) Calculation of Standard Reflected Light Amount Arr Assuming that the first distance measuring device 300A and the object W are fixed in respective positions, reflected light Lr which is reflected by the object W and returns to the first distance measuring device 300A can be the to be of a constant intensity (light amount per unit time). Further, because time period P1 is set to a time period during which only ambient light Ls is incident on the photoelectric conversion element 10, photoelectrons due to ambient light Ls only are stored in the first capacitor Ca1. On the other hand, because time period P3 is set to a time period during which both ambient light Ls and reflected light Lr are incident on the photoelectric conversion element 10, photoelectrons due to both ambient light Ls and reflected light Lr are stored in the third capacitor Ca3. Moreover, time period P1 and time period P3 are of the same length.

Owing thereto, the difference between the charge amount Q3 stored in the third capacitor Ca3 and the charge amount Q1 stored in the first capacitor Ca1 is indicative of an accumulated light amount (standard reflected light amount Arr) of reflected light Lr in time period P3 (=time period P1).

(ii) Calculation of Measured Reflected Light Amount Amr and of Round-Trip Time Period ΔP Assuming that the first distance measuring device 300A and the object W are fixed in respective positions, reflected light Lr which is reflected by the object W and returns to the first distance measuring device 300A can be the to be of a constant intensity. Further, because time period P2 is set to a time period during which only ambient light Ls is incident on the photoelectric conversion element 10, photoelectrons due to ambient light Ls only are stored in the second capacitor Ca2. On the other hand, because time period P4 is set to a time period including a time period Psr during which both ambient light Ls and reflected light Lr are incident on the photoelectric conversion element 10 and a time period Ps during which only ambient light Ls is incident on the photoelectric conversion element 10, photoelectrons due to both ambient light Ls and reflected light Lr are stored in the fourth capacitor Ca4. Moreover, time period P2 and time period P4 are of the same length.

Owing thereto, the difference between the charge amount Q4 stored in the second capacitor Ca4 and the charge amount Q2 stored in the second capacitor Ca2 is indicative of an accumulated light amount (measured reflected light amount Amr) of reflected light Lr in time period P4 (=time period P2). In the first distance measuring device 300A, time period P4 is started simultaneously with the time Ted at which irradiation of radiant light Le is stopped. As a result, during time period P4, reflected light Lr corresponding to the pulse round trip ΔP is made incident on the photoelectric conversion element 10, and photoelectrons are stored in the fourth capacitor C4. Accordingly, the charge amount Q4 stored in the fourth capacitor Ca4 corresponds to the sum (measured composite light amount Ami) of the accumulated light amount of ambient light Ls (measured ambient light amount Ams) and the accumulated light amount of reflected light Lr (measured reflected light amount Amr) over the entire time period P4. Owing thereto, the difference between the charge amount Q4 and the charge amount Q2 is indicative of a charge amount corresponding to the measured reflected light amount Amr. The round-trip time period ΔP is dependent on the distance D between the first distance measuring device 300A and the object W. Therefore, the ratio between the measured reflected light amount Amr (which corresponds to the difference between the charge amount Q4 and the charge amount Q2) and the standard reflected light amount Arr (which corresponds to the difference between the charge amount Q3 and the charge amount Q1) is equal to the ratio between the round-trip time period ΔP and time period P3 (=time period P1) (Amr:Arr=Q4−Q2:Q3−Q1=ΔP:P3). Accordingly, the round-trip time period ΔP can be calculated by the following equation (F3).

$$\Delta P = \{(Q4-Q2)/(Q3-Q1)\} \times P3 \tag{F3}$$

(iii) Calculation of Distance D

If the round-trip time period ΔP is known, the distance D between the first distance measuring device 300A and the object W can be calculated by the following equation (F4). In equation F4, c is a constant indicative of the speed of light (roughly 300,000 meters per second). Further, the reason that the product c×ΔP is divided by 2 is due to the fact that the interval between the first distance measuring device 300A and the object W is traversed by the pulsed light Lp as a round trip in the round-trip time period ΔP, and thus a distance is covered that is two times the distance D.

$$D = (c \times \Delta P)/2 \tag{F4}$$

(iv) Other Features

As initial settings (reset operations) for the pixel 304, processes such as those described below may be carried out. More specifically, at first, the first through fourth reset switches SR1 to SR4 are turned ON simultaneously corresponding to transmission of the first through fourth reset signals Sr1 to Sr4 with respect to the first through fourth reset switches SR1 to SR4 (i.e., the voltages supplied to the respective gates of the first through fourth reset switches SR1 to SR4 are made high in level). At the same time, the fifth switching element SW5 is turned ON by transmitting the charging discharging signal Sde to the fifth switching element SW5 (i.e., the voltage supplied to the fifth switching element SW5 is made high in level). At this time, by controlling the fifth switching element SW5, and the voltage V, which are supplied to the electrode 16 of the photoelectric conversion element 10, using the same timing and operations shown in time period WD3 of FIG. 15 above, photoelectrons generated by the photoelectric conversion element 10 including the electrode 16 are discharged via the charge discharging unit 108, so that charges do not remain in the photoelectric conversion element 10, whereby the photoelectric conversion element 10 is initialized (however, note that SW3 in FIG. 15 corresponds to SW5 in the pixel 304).

Furthermore, gate drive signals Sg1 to Sg4 are not sent with respect to the first through fourth switching elements SW1 to SW4 (i.e., the voltages supplied to the respective gates of the first through fourth switching elements SW1 to SW4 are made low in level), whereby the first through fourth switching elements SW1 to SW4 are turned OFF. As a result of this process, the first through fourth capacitors Ca1 to Ca4 are set to the reset potential. Then, after transmission of the first through fourth reset signals Sr1 to Sr4 with respect to the first through fourth reset switches SR1 to SR4 is stopped (i.e., the voltages supplied to the respective gates of the first through fourth reset switches SR1 to SR4 are made low in level), the aforementioned processes at the timings shown in FIG. 20 are carried out.

(4) Details of Measurement Method (for First Accumulating Period Tca1)

In the above-described sections (2) and (3), a case for one second accumulating period Tca2 has been described. However, with the first distance measuring device 300A, the round-trip time period ΔP is calculated in the same manner as described above, using charges Q1 to Q4 stored in the first through fourth capacitors Ca1 to Ca4 (hereinafter referred to as "charge amounts sQ1 to sQ4"), but taken over one hundred instances of the second accumulating period Tca2 (i.e., in the first accumulating period Tca1).

The charge amount sQ1 is the sum total of the charge amounts Q1 stored in the first capacitor Ca1 over respective 1st through 100th instances of the second accumulating period Tca2. Similarly, the charge amounts sQ2 to sQ4 are the sum totals of charge amounts Q2 to Q4 stored in the second through fourth capacitors Ca1 to Ca4 over respective 1st through 100th instances of the second accumulating period Tca2.

In this case, the round-trip time period ΔP can be calculated by the following equation (F5) in accordance with the foregoing equation (F3).

$$\Delta P = \{(sQ4-sQ2)/(sQ3-sQ1)\} \times P3 \tag{F5}$$

Based on the round-trip time period ΔP determined by equation (F5), the distance D between the first distance measuring device 300A and the object W can be determined using the foregoing equation (F4). Solutions to such calculations can be determined in the arithmetic processor 206.

In this manner, if the distance is determined by the charge amounts sQ1 to sQ4 stored in the first through fourth capacitors Ca1 to Ca4 in one hundred instances of the second accumulating period Tca2, the signal light component can be increased, and thereafter, signal processing accuracy (distance calculation accuracy) can be increased.

(5) Other Features

With the first distance measuring device 300A, the distance D is measured using charge amounts Q1 to Q4 (charge information) in a plurality of respective pixels 304. As a result, by combining together the distance information in each of the pixels 304, a three dimensional image can be obtained.

[Effects of the First Distance Measuring Device 300A]

With the above-described first distance measuring device 300A, the dynamic range of the distance measurement can be improved, together with enabling the influence of ambient light Ls to be reduced or eliminated.

More specifically, in the first distance measuring device 300A, a charge amount Q1, which is accumulated in a time period P1 during which only ambient light Ls is incident on the photoelectric conversion element 10, and a charge amount Q3, which is accumulated in a time period P3 during which both ambient light Ls and reflected light Lr are incident on the photoelectric conversion element 10, are determined. By setting time periods P1 and P3 to the same length, a charge amount corresponding to reflected light Lr in time period P3 (i.e., the standard reflected light amount Arr of reflected light Lr in time period P3) can be determined from the difference between the charge amount Q3 and the charge amount Q1 (Q3−Q1).

Further, a charge amount Q2, which is accumulated in a time period P2 during which only ambient light Ls is incident on the photoelectric conversion element 10, and a charge amount Q4, which is accumulated in a time period P4, are determined. In time period P4, there are included a period (time period Psr) during which both ambient light Ls and reflected light Lr are incident on the photoelectric conversion element 50, and a period (time period Ps) during which only ambient light is incident on the photoelectric conversion element 50. Due to the fact that time period P2 and time period P4 are set to the same length, a charge amount corresponding to time period Psr within time period P4 (which corresponds to the reflected light Lr in time period Psr) can be determined from the difference between the charge amount Q4 and the charge amount Q2 (Q4−Q2).

If the interval during which reflected light is made incident on the photoelectric conversion element 10, and the intensity Ir of the reflected light Lr is constant, then the ratio of the difference between the charge amounts Q4 and Q2 and the difference between the charge amounts Q3 and Q1 (Q4−Q2: Q3−Q1) is equal to the ratio of time period Psr and time period P3 (Psr:P3). Owing thereto, time period Psr can be determined by the following equation (F6).

$$Psr = \{(Q4-Q2)/(Q3-Q1)\} \times P3 \tag{F6}$$

Since time Ted and time Tg4u are equal, time period Psr equals the round-trip time period ΔP. Accordingly, the round-trip time period ΔP can be calculated from equation (F6) above, and as a result, the distance D can be calculated based on the round-trip time period ΔP and the speed of light.

In this manner, with the first distance measuring device 300A, because the charge amount Q2 that occurs due to ambient light Ls can be removed, the influence of ambient light Ls can be eliminated or reduced.

Further, as the distance D becomes shorter, the incidence period of the reflected light (i.e., time period Psr) becomes shorter, whereas as the distance D becomes longer, time period Psr becomes longer. In general, if the same object W is used, as the distance D becomes shorter, the intensity Ir of the reflected light Lr becomes greater, whereas as the distance D becomes longer, the intensity Ir of the reflected light Lr becomes smaller. Therefore, in the case of a short distance D, reflected light Lr, which is of a large intensity Ir, is made incident for a short time period, while in the case of a long distance D, reflected light Lr, which is of a small intensity Ir, is made incident for a long time period. As a result, compared with the amount of change in the distance D, the amount of change in the light amount Ar of reflected light Lr that is incident in time period Psr becomes small. Such a practice leads to an improvement in the dynamic range of the first distance measuring device 300A.

With the first distance measuring device 300A, in each cycle Cm, pulsed light Lp is irradiated one hundred times, and after photoelectrons have been accumulated respectively one hundred times in the first through fourth capacitors Ca1 to Ca4, the round-trip time amount ΔP is calculated using charge amounts Q1 through Q4. In general, the intensity of ambient light Ls (e.g., sunlight) is always changing. Thus, by irradiating the pulsed light Lp one hundred times in each cycle Cm, and by calculating the round-trip time period ΔP using charge amounts Q1 through Q4 after photoelectrons have been accumulated for a number of times corresponding thereto, the intensity of the ambient light Ls can be averaged. As a result, the precision in removal of charge amounts occurring due to ambient light Ls can be increased, and measurement accuracy can be enhanced.

With the first distance measuring device 300A, the pulse width (output time period) of the pulsed light Lp is 10 microseconds (=100 nanometers×100 times), which is 0.05% of each cycle Cm (20 milliseconds). In conjunction therewith, time periods P1 to P4 during which the first through fourth switching elements SW1 to SW2 are turned ON are set to be short. For this reason, even in the case that another distance measuring device, which uses pulsed light of the same frequency, exists in the vicinity of the first distance measuring device 300A, the possibility that the timing at which the other distance measuring device outputs pulsed light will interfere with the timing at which the first distance measuring device 300A outputs pulsed light Lp is low. As a result, the possibility for interference with another distance measuring device (i.e., that pulsed light from the other distance measuring device will be mistakenly recognized as pulsed light Lp from the first distance measuring device 300A) can be reduced.

In addition, because time periods P1 to P4 during which the first through fourth switching elements SW1 to SW4 are turned ON are also set to be short, the time period during which ambient light Ls is incident on the photoelectric conversion element 10 in time periods P1 to P4 can be made short. This enables the influence of ambient light Ls as a noise component to be small, and improves the signal-to-noise (S/N) ratio. In particular, in the case that such ambient light Ls is sunlight, shot noise from sunlight can be reduced.

With the first distance measuring device 300A, time periods P1 to P4 during which the first through third switching elements SW1 to SW4 are turned ON in each cycle Cm is extremely short. For this reason, the possibility for a phenomenon (so called "aliasing") to occur, in which pulsed light Lp that was irradiated in the earliest last cycle Cm is detected in the current cycle Cm, can be reduced. More specifically, since each of the accumulating periods Tca2 of the first distance measuring device 300A is 100 microseconds, and the time period Pe during which pulsed light Lp is irradiated is short, such pulsed light Lp is irradiated at intervals of about 100 microseconds. Since the speed of light c is about 300,000 kilometers per second, the possibility for aliasing to occur exists only if the actual position of the object W is 15 kilometers (=100 μs×30[Mm/s]/2) farther than the distance D output by the first distance measuring device 300A. However, because the intensity of pulsed light Lp, which is irradiated to the object W from the light emitter 210, is reduced in proportion to the square of the distance D, the intensity Ir of reflected light Lr from a position that is 15 kilometers farther than the distance D is very small compared to the intensity Ir of reflected light Lr from the object W at the distance D, thus making it almost impossible for the photoelectric conversion element 10 to detect such reflected light Lr. Accordingly, the first distance measuring device 300A is capable of preventing aliasing from occurring.

[Other Timing Charts]

In the examples given above, the first through fourth switching elements SW1 to SW4 are controlled in accordance with the timing chart of FIG. 20, however, the invention is not limited by this feature. For example, time periods P3, P4 of FIG. 20 may be positioned in front of time periods P2, P1. Further, time Tg1$d$ and time Tg2$u$ occur simultaneously, however, time Tg2$u$ can also occur later than or after time Tg1$d$. The relationship between time Tg2$d$ and time Teu also is the same as the relationship between time Tg3$d$ and time Tg4$u$. Furthermore, time Tg4$u$ need not necessarily occur at the same time as time Ted, so long as a correlative relationship between time Tg4$u$ and time Ted is known.

Figure 21:
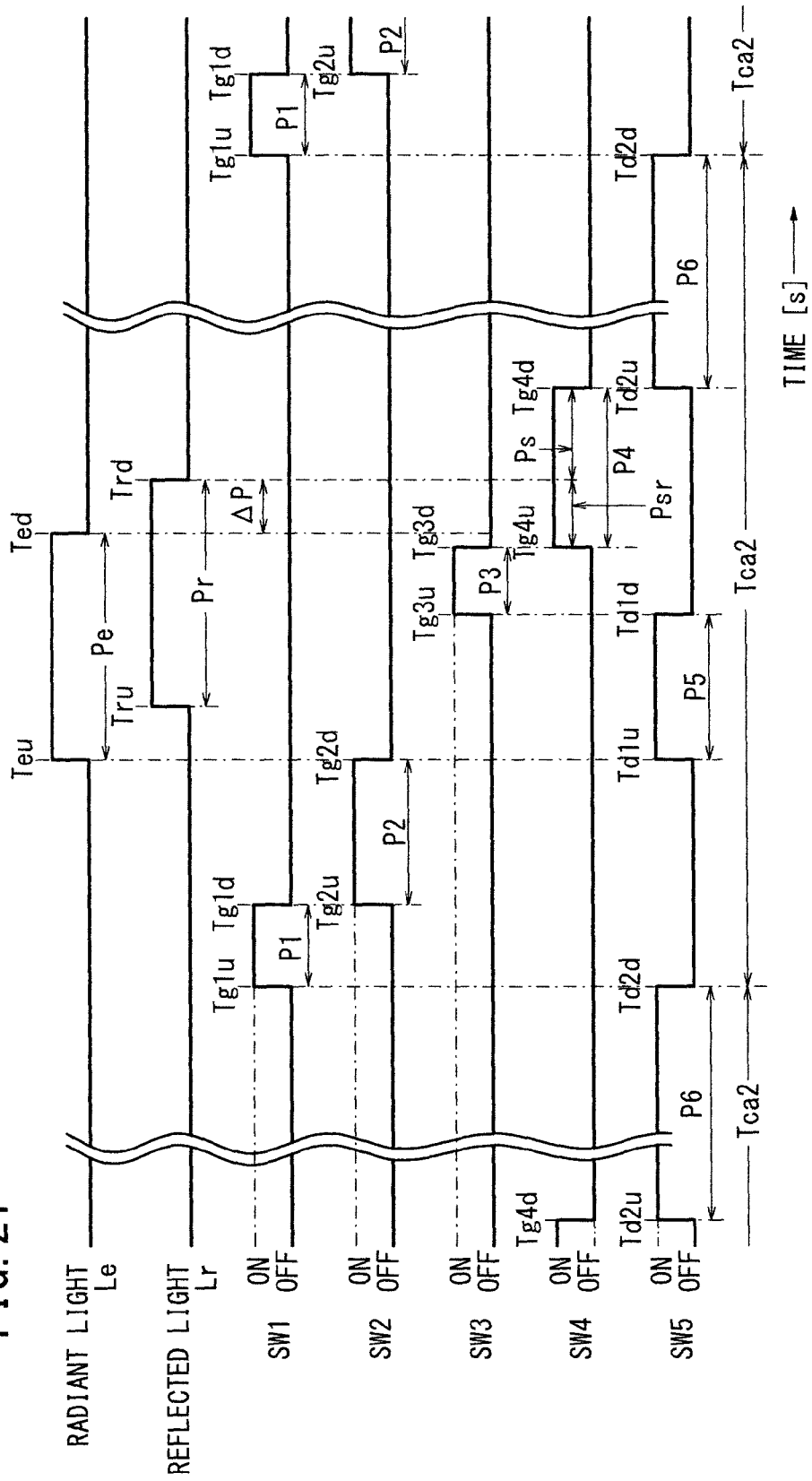
FIG. 21 is a timing chart showing another example of radiant light, reflected light, and ON/OFF timings of first through fifth switching elements within each of respective second accumulation periods Tca2.

In FIG. 21, a timing chart is shown in which time Ted occurs after time Tg4. In this case, the round-trip time period ΔP can be calculated using the following equation (F7).

$$\Delta P = [(Q4-Q2)/(Q3-Q1)] \times P3 - (Ted - Tg4u) \quad (F7)$$

Alternatively, time Ted can occur before time Tg4$u$. In this case, the round-trip time period ΔP can be calculated using the following equation (F8).

$$\Delta P = [(Q4-Q2)/(Q3-Q1)] \times P3 + (Tg4u - Ted) \quad (F8)$$

In the above examples, although time periods P1 and P2 were provided in order to eliminate or reduce the influence of ambient light Ls, for example, in the case of a location in which ambient light Ls does not exist, such as a darkroom or the like, or if the amount of ambient light Ls is small with respect to the reflected light Lr, and thus the influence of ambient light Ls is small, then the round-trip time period ΔP can be determined only from times P3 and P4. More specifically, the round-trip time period ΔP can be calculated using the following equation (F9).

$$\Delta P = (Q4/Q3) \times P3 \quad (F9)$$

[Second Distance Measuring Device 300B]

A distance measuring device (hereinafter referred to as a second distance measuring device 300B) according to a second embodiment shall be described below with reference to FIGS. 16 and 22.

Figure 16:
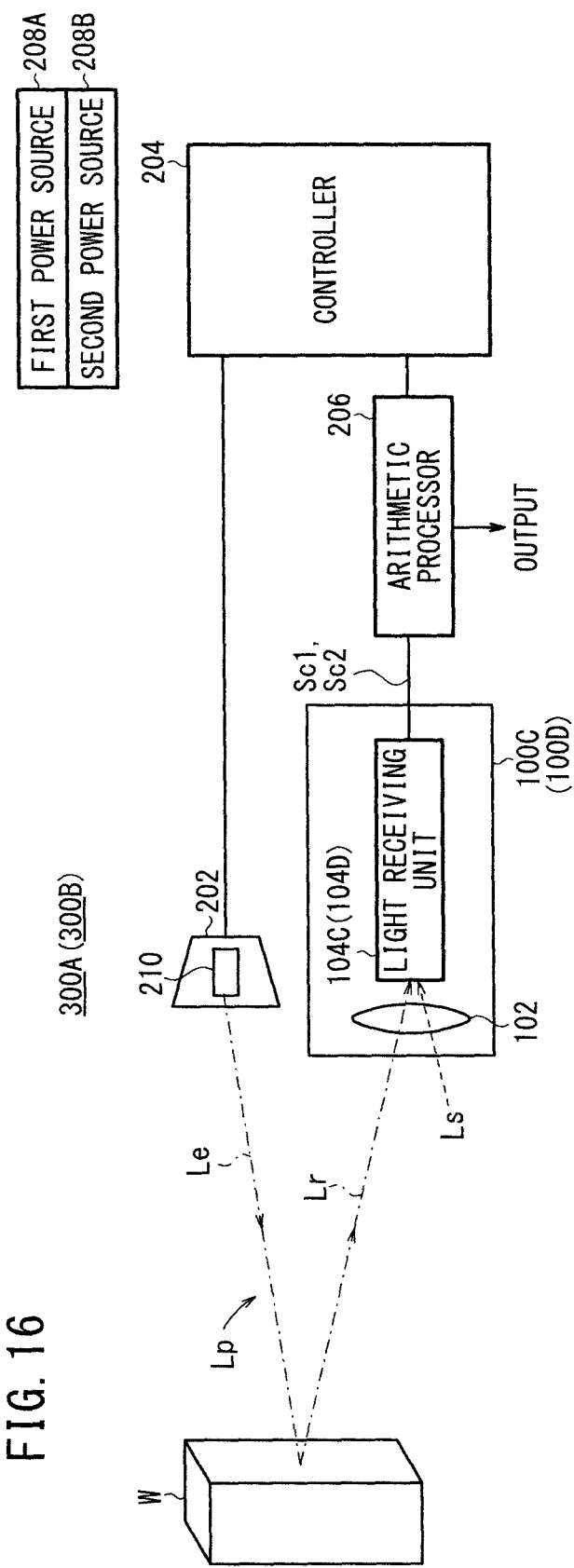
FIG. 16 is a schematic diagram showing a first distance measuring device and a second distance measuring device.

As shown in FIG. 16, the second distance measuring device 300B includes roughly the same structure as the aforementioned first distance measuring device 300A, but differs therefrom in that, in place of the third light receiving device 100C, a fourth light receiving device 100D having a fourth light receiving unit 104D (see FIG. 22) is used.

<Outline of Fourth Light Receiving Device 100D>

The fourth light receiving device 100D performs a suitable signal output when reset noise is to be removed. More specifically, with the aforementioned third light receiving device 100C, after the first through fourth capacitors Ca1 to Ca4 have all been reset, the first through fourth switching elements SW1 to SW4 are turned ON respectively, whereby photoelectrons residing in the charge accumulating unit 26 are allocated to the first through fourth capacitors Ca1 to Ca4. Furthermore, for increasing the signal quantity, after such operations have been carried out multiple times, the signal quantity is voltage-converted and read out by an external circuit. However, in resetting of each cycle (between frames), due to noise from the circuit configuration, because the reset voltage is not constant, between frames, differing levels of reset noise components are added into the first through fourth capacitors Ca1 to Ca4.

Thus, with the fourth light receiving device 100D, potentials immediately following resetting of the first through fourth capacitors Ca1 to Ca4 are read out (reset voltage readout), and then voltage outputs are read out (signal readout) according to the signal charges stored in the capacitors Ca1 to Ca4 thereafter, so that reset noise components can be removed by respective differential operations.

<Details of Fourth Light Receiving Device 100D>

Figure 22:
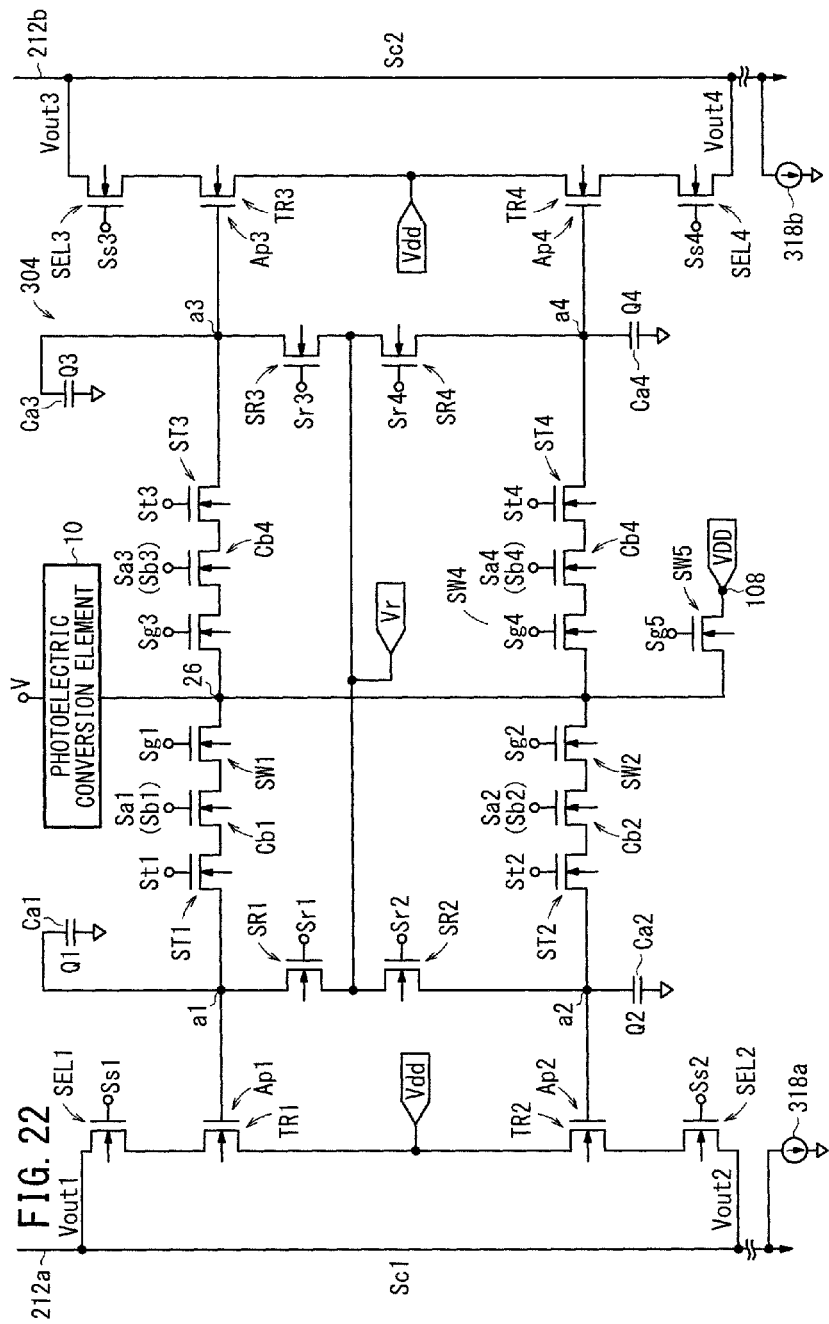
FIG. 22 is a circuit diagram showing respective pixels in a fourth light receiving unit of the fourth light receiving device, which is arranged in the second distance measuring device.

As shown in FIG. 22, a fourth light receiving unit 104D of the fourth light receiving device 100D has basically the same structure as that of the aforementioned third light receiving device 100C, but differs therefrom in that first through fourth charge holding units Cb1 to Cb4 and first through fourth charge transfer units ST1 to ST4 are included therein.

(First Through Fourth Charge Holding Units Cb1 to Cb4/First Through Fourth Charge Transfer Units ST1 to ST4)

The first charge holding unit Cb1 is constituted, for example, by a capacitor of a MOS-type structure, which is connected to the drain of the first switching element SW1, and which is arranged so that gate drive signals (first accumulating signal Sa1 (high level)/first discharging signal Sb1 (low level)) are supplied to the gate thereof from the gate drive circuit 306.

The first charge transfer unit ST1 is constituted, for example, by an n-channel MOS transistor, with the source connected to the first charge holding unit Cb1, the drain connected to the first capacitor Ca1, and a gate drive signal (first transfer signal St1) being supplied to the gate thereof.

Accordingly, in accordance with supply of the first accumulating signal Sa1 from the gate drive circuit 306 with respect to the gate of the first charge holding unit Cb1, a potential location beneath the gate of the first charge holding unit Cb1 is lowered, and photoelectrons transferred through the first switching element SW1 are temporarily accumulated. Thereafter, in accordance with supply of the first discharging signal Sb1 with respect to the gate of the first charge holding unit Cb1, together with supply of the first transfer signal St1 (high level) with respect to the gate of the first charge transfer unit ST1, the photoelectrons stored in the first charge holding unit Cb1 are transferred to the first capacitor Ca1. Because the gate of the first charge holding unit Cb1 and the gate of the first charge transfer unit ST1 can be respectively controlled independently from each other, charges can be transferred to the first capacitor Ca1 without causing residual charges to remain in the first charge holding unit Cb1.

The second through fourth charge holding units Cb2 to Cb4, and the second to fourth charge transfer units ST1 to ST4 are the same as described above, with gate drive signals (second through fourth accumulating signals Sa2 to Sa4 (high level)/second through fourth discharging signals Sb2 to Sb4 (low level)) from the drive circuit 306 being supplied to each of the gates of the second through fourth charge holding units Cb2 to Cb4, and gate drive signals (second through fourth transfer signals St2 to St4) from the drive circuit 306 being supplied to each of the gates of the second through fourth charge transfer units ST2 to ST4.

The first through fourth charge holding units Cb1 to Cb4 may also be constituted by embedded photodiode structures or by parasitic capacitances.

[Operations of Second Distance Measuring Device 300B]

Operations of the second distance measuring device 300B are substantially the same as in the aforementioned first distance measuring device 300A. For example, as shown in FIGS. 19 and 20, in the first accumulating period Tca1 of each cycle Cm, first through fourth accumulating signals Sa1 to Sa4 are supplied to each of the gates of the first through fourth charge holding units Cb1 to Cb4, whereby photoelectrons transferred through the first switching element SW1 in time period P1 of each second accumulating period Tca2 are stored in the first charge holding unit Cb1, photoelectrons transferred through the second switching element SW2 in time period P2 are stored in the second charge holding unit Cb2, photoelectrons transferred through the third switching element SW3 in time period P3 are stored in the third charge holding unit Cb3, and photoelectrons transferred through the fourth switching element SW4 in time period P4 are stored in the fourth charge holding unit Cb4.

In this manner, after signal charges have been stored in the first through fourth charge holding units Cb1 to Cb4, as an initial setting means for the readout period Tr in each cycle Cm, the first through fourth capacitors Ca1 to Ca4 are reset. More specifically, corresponding to first through fourth reset signals Sr1 to Sr4 being sent with respect to the first through fourth reset switches SR1 to SR4 (i.e., the voltages supplied to respective gates of the first through fourth reset switches SR1 to SR4 are made high in level), the first through fourth reset switches are turned ON simultaneously, and predetermined reset voltages Vr are set therein. Thereafter, by sequentially turning ON the first through fourth output switches SEL1 to SEL4, the reset voltages of the first through fourth capacitors Ca1 to Ca4 are output to an external circuit as first through fourth output voltages Vout1 to Vout4 (reset voltage readout).

In addition, signals are then read out immediately following the reset voltage readout from the first through fourth capacitors Ca1 to Ca4. More specifically, first through fourth discharging signals Sb1 to Sb4 are supplied to each of the gates of the first through fourth charge holding units Cb1 to Cb4, together with first through fourth transfer signals St1 to St4 being supplied to each of the gates of the first through fourth charge transfer units ST1 to ST4, whereby the photoelectrons stored in the first through fourth charge holding units Cb1 to Cb4 are transferred respectively to the first through fourth capacitors Ca1 to Ca4. In addition, by sequentially turning ON the first through fourth output switches SEL1 to SEL4, a voltage corresponding to the photoelectrons (charge amount Q1) stored in the first capacitor Ca1 and a voltage corresponding to the photoelectrons (charge amount Q2) stored in the second capacitor Ca2 are amplified respectively by the first output element TR1 and the second output element TR2, and such voltages are output as the first output voltage Vout1 and the second output voltage Vout2, and further, a voltage corresponding to the photoelectrons (charge amount Q3) stored in the third capacitor Ca3 and a voltage corresponding to the photoelectrons (charge amount Q4) stored in the fourth capacitor Ca4 are amplified respectively by the third output element TR3 and the fourth output element TR4, and such voltages are output as the third output voltage Vout3 and the fourth output voltage Vout4 (signal readout).

By determining the differential between the reset voltages read out in the reset voltage readout step, and the signal voltages read out in the signal readout step, signals can be read out without incurring any influence of the reset voltage values. As a method for determining the differential, calculation thereof can be realized, for example, by a correlated double sampling (CDS) circuit.

The photoelectric conversion element, the light receiving device, the light receiving system, and the distance measuring device according to the present invention are not limited to the above embodiments, and it is a matter of course that various additional or modified structures could be adopted therein without deviating from the essence and gist of the present invention. A few modified examples will be described below.

[Modified Example of Photoelectric Conversion Element 10]

Figure 23:
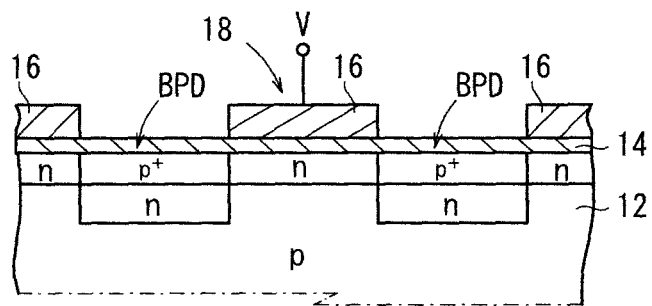
FIG. 23 is a cross sectional view showing a modified example of a photoelectric conversion element.

For example, as shown in FIG. 23, an embedded MOS diode in which there is formed an n-type impurity diffusion region on the surface of a p-type impurity diffusion region may be used.

[Second Photoelectric Conversion Element 10B]

Figure 24:
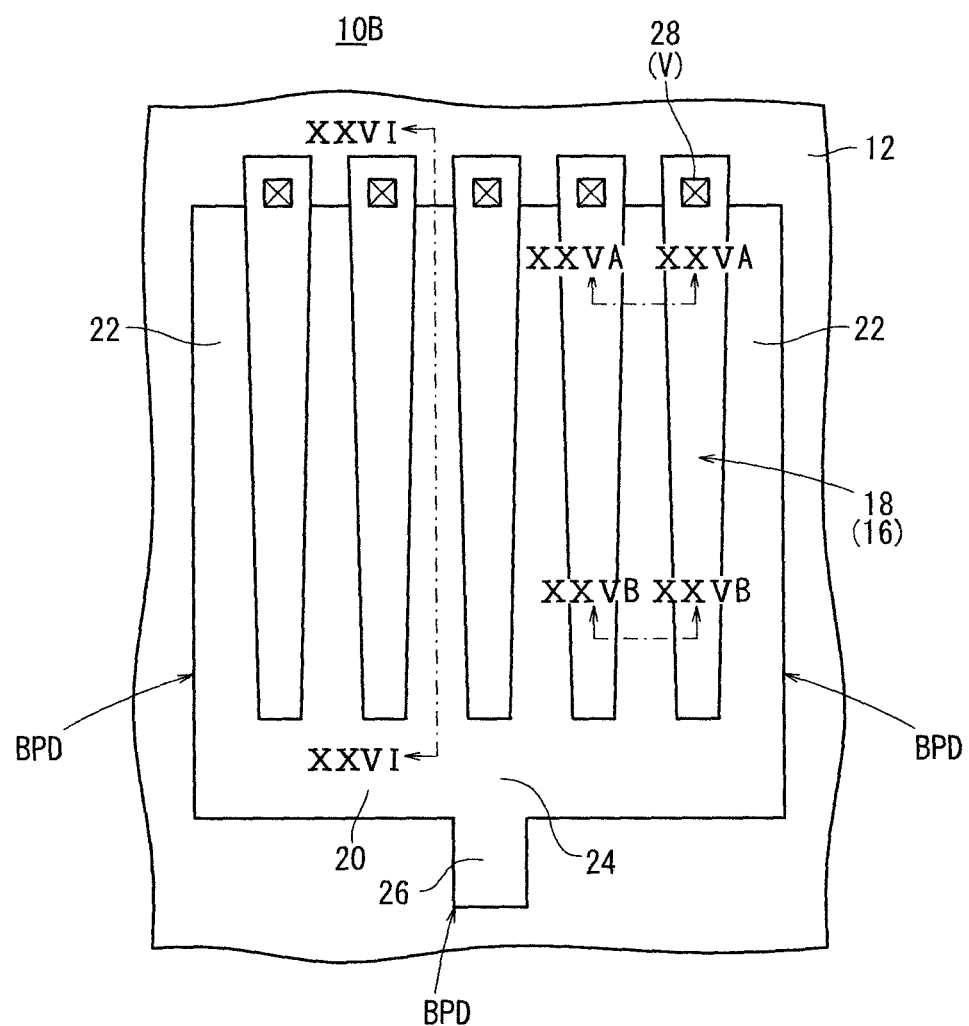
FIG. 24 is a view showing a second photoelectric conversion element as seen from an upper surface thereof.

Next, as shown in FIG. 24, a photoelectric conversion element according to a second embodiment (hereinafter referred to as a second photoelectric conversion element 10B) has substantially the same structure as the aforementioned photoelectric conversion element 10, but differs therefrom in the shapes for the embedded photodiode and the electrodes 16 as viewed from the upper surface.

More specifically, the branch portions 22 of the embedded photodiode BPD have shapes that gradually widen toward the one portion 20 as viewed from the upper surface, whereas each of the electrodes 16 have shapes such that the electrode widths thereof gradually become smaller or narrower toward the one portion 20 as viewed from the upper surface.

Figure 26:
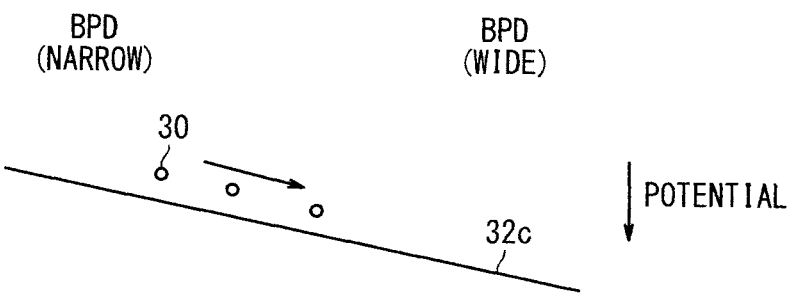
FIG. 26 is a potential diagram taken along line XXVI-XXVI in FIG. 24.

In the case that potential locations $32c1$ of the embedded photo diode BPD are focused on and observed, as shown in FIGS. 25A and 25B, at the narrow portions, as a result of receiving an influence from the surface potential of the semiconductor substrate 12 (silicon substrate), the potential location $32c1$ of such portions becomes high, whereas the potential location $32c2$ of the wide portions becomes low. Accordingly, as shown in FIG. 26, the potential locations $32c2$ of the branch portions 22 of the embedded photodiode BPD are lowered as the width of the branch portions 22 becomes wider, resulting in the potential locations $32c$ slanting downward toward the one portion 20. As a result, photoelectrons 30 are moved at high speeds toward the charge accumulating unit 26.

[Third Photoelectric Conversion Element 10C]

Figure 27:
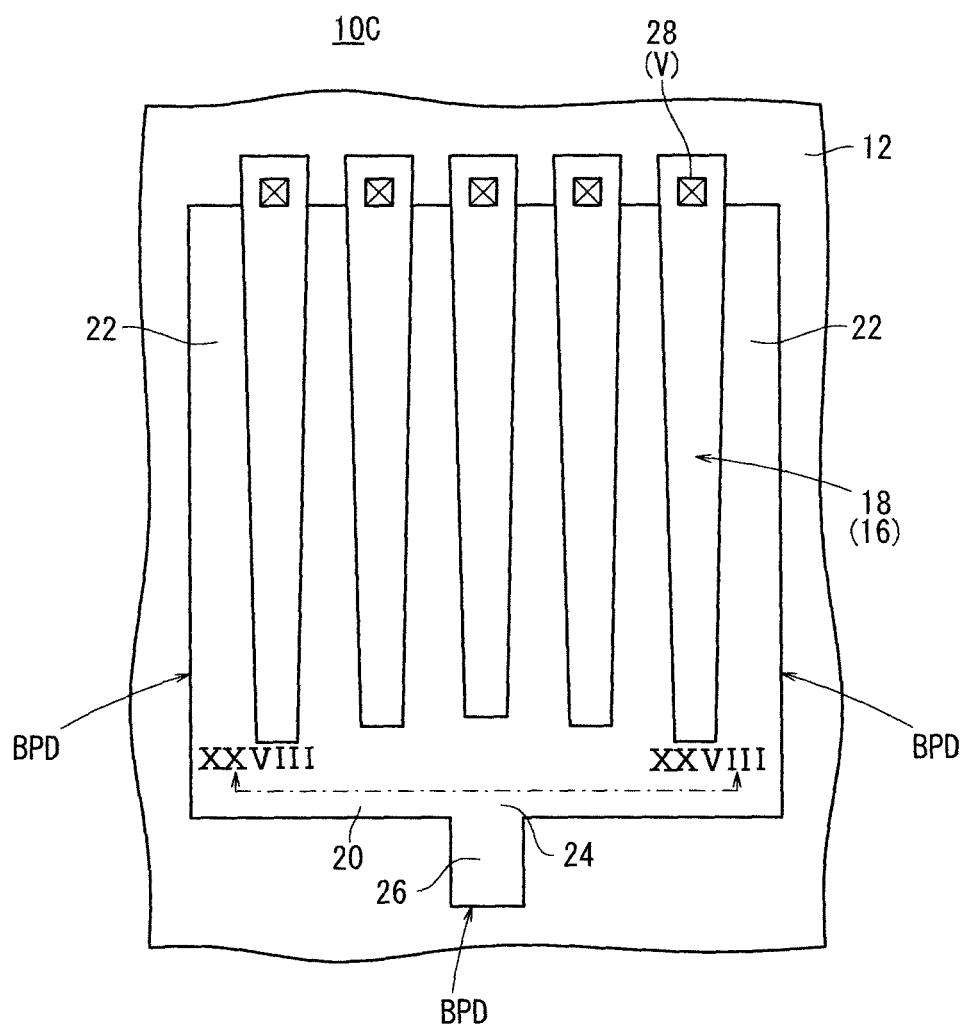
FIG. 27 is a view showing a fourth photoelectric conversion element as seen from an upper surface thereof.

Next, as shown in FIG. 27, a photoelectric conversion element according to a third embodiment (hereinafter referred to as a third photoelectric conversion element 10C) has substantially the same structure as the aforementioned second photoelectric conversion element 10B, but differs therefrom in that the width of one region 20 in the embedded photodiode BPD is formed to widen gradually from both ends toward a central base portion 24. More specifically, the base portion 24 is formed such that the width thereof, which leads to the charge accumulating unit 26, is greatest.

Figure 28:
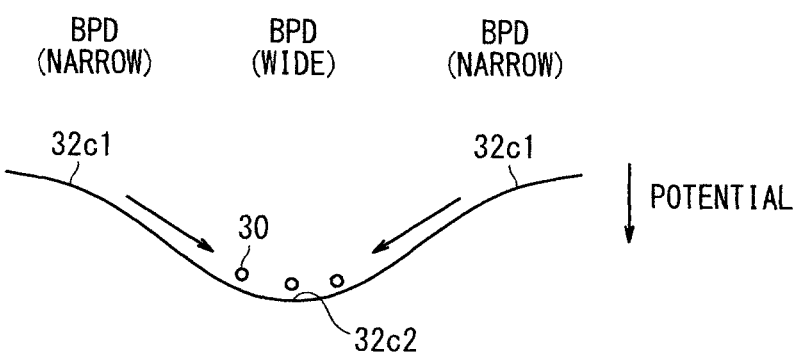
FIG. 28 is a potential diagram view taken along line XXVIII-XXVIII in FIG. 27.

In the case that the potential location $32c$ in the one region 20 of the embedded photo diode BPD is focused on and observed, as shown in FIG. 28, potential locations $32c1$ of the narrow portions become high, whereas the potential location $32c2$ of the wide portion becomes low. Accordingly, the potential location $32c$ of the one region 20 in the embedded photodiode BPD decreases gradually, and more specifically, is slanted downward, from both ends toward the base portion 24. In this manner, due to the fact that a downwardly slanted potential gradient is formed from both ends of the one region 20 in the embedded photodiode BPD toward the base portion 24 (i.e., the charge accumulating unit 26), photoelectrons 30 are made to migrate at higher speeds toward the charge accumulating unit 26.

The invention claimed is:

1. A photoelectric conversion element for detecting light and converting the light into photoelectrons, comprising:
   an embedded photodiode that is embedded in a semiconductor substrate; and
   a plurality of metal-oxide-semiconductor (MOS) diodes having electrodes formed on the semiconductor substrate with an insulator therebetween,
   wherein the embedded photodiode has a comb-like shape when viewed from an upper surface thereof, in which plural branch portions are branched from one portion, and
   the electrodes of the MOS diodes are nested, respectively, between the branch portions of the embedded photodiode when viewed from the upper surface thereof,
   wherein the potential under the electrodes of the MOS diodes is controlled such that the photoelectrons generated by photoelectric conversion at the MOS diodes migrate toward the embedded photodiode.

2. The photoelectric conversion element according to claim 1, wherein within the embedded photodiode, a portion corresponding to a base of the one portion of the embedded photodiode is constituted as a charge accumulating unit.

3. The photoelectric conversion element according to claim 1, wherein the plural branch portions of the embedded photodiode and the electrodes in the MOS diodes are rectangular shaped respectively.

4. The photoelectric conversion element according to claim 1, wherein each of the plural branch portions of the embedded photodiode are shaped so as to become gradually greater in width toward the one portion as viewed from the upper surface thereof, and each of the electrodes of the MOS diodes is shaped so as to become gradually smaller in width toward the one portion of the embedded photodiode as viewed from the upper surface thereof.

5. The photoelectric conversion element according to claim 2, wherein the one portion of the embedded photodiode is shaped so as to become gradually greater in width toward the base on the one electrode portion as viewed from the upper surface thereof.

6. The photoelectric conversion element according to claim 2, wherein power supply terminal of each of the electrodes in the MOS diodes are formed at positions maximally separated from the charge accumulating unit as viewed from the upper surface thereof.

7. A light receiving device that acquires luminance information of incident light, comprising:
   a photoelectric conversion element, which detects and converts the incident light into photoelectrons;
   a charge accumulating unit for accumulating photoelectrons generated by the photoelectric conversion element;
   a capacitor that stores the photoelectrons at a fixed time period;
   a charge discharging unit that discharges the photoelectrons;
   a first metal-oxide-semiconductor (MOS)-type switching element disposed between the charge accumulating unit and the capacitor for causing the photoelectrons accumulated in the charge accumulating unit to migrate toward the capacitor; and
   a second MOS-type switching element disposed between the charge accumulating unit and the charge discharging unit for controlling discharge of the photoelectrons from the charge accumulating unit to the charge discharging unit,
   wherein the photoelectric conversion element comprises:
   an embedded photodiode embedded in a semiconductor substrate; and
   a plurality of MOS diodes having electrodes formed on the semiconductor substrate with an insulator therebetween,
   wherein the embedded photodiode has a comb-like shape when viewed from an upper surface thereof, in which plural branch portions are branched from one portion,
   the electrodes of the MOS diodes are nested, respectively, between the plural branch portions of the embedded photodiode when viewed from the upper surface thereof, and
   the photoelectrons from the photoelectric conversion element are transferred to the capacitor by selectively controlling opening or closing of the first MOS-type switching element and the second MOS-type switching element, wherein luminance information of incident light is acquired based on a charge amount of the photoelectrons transferred to the capacitor.

8. The light receiving device according to claim 7, wherein:
   the charge accumulating unit is connected to the photoelectric conversion element; and
   the charge discharging unit is disposed across from the capacitor while sandwiching the charge accumulating unit therebetween.

9. The light receiving device according to claim 7, wherein the capacitor comprises one of a metal-insulator-metal (MIM) capacitor, a MOS capacitor, an embedded photodiode structure, or a p-n junction parasitic capacitance.

10. The light receiving device according to claim 7, wherein at least the charge accumulating unit, the first MOS-type switching element, the second MOS-type switching element, and the capacitor are formed in a light shielded region.

* * * * *